US012543372B2

(12) United States Patent
Wang et al.

(10) Patent No.: US 12,543,372 B2
(45) Date of Patent: Feb. 3, 2026

(54) DISPLAYING BASE PLATE AND MANUFACTURING METHOD THEREOF, AND DISPLAYING DEVICE

(71) Applicant: BOE Technology Group Co., Ltd., Beijing (CN)

(72) Inventors: Lizhong Wang, Beijing (CN); Ce Ning, Beijing (CN); Yunping Di, Beijing (CN); Binbin Tong, Beijing (CN); Zhen Zhang, Beijing (CN); Zhenyu Zhang, Beijing (CN); Fuqiang Li, Beijing (CN); Chengfu Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 762 days.

(21) Appl. No.: 17/772,395

(22) PCT Filed: Jun. 29, 2021

(86) PCT No.: PCT/CN2021/103217

§ 371 (c)(1),
(2) Date: Apr. 27, 2022

(87) PCT Pub. No.: WO2023/272504

PCT Pub. Date: Jan. 5, 2023

(65) Prior Publication Data

US 2024/0194698 A1 Jun. 13, 2024

(51) Int. Cl.
*H10D 86/40* (2025.01)
*H10D 86/01* (2025.01)
*H10D 86/60* (2025.01)

(52) U.S. Cl.
CPC ......... *H10D 86/60* (2025.01); *H10D 86/0221* (2025.01); *H10D 86/421* (2025.01); *H10D 86/441* (2025.01); *H10D 86/471* (2025.01)

(58) Field of Classification Search
None
See application file for complete search history.

(56) References Cited

U.S. PATENT DOCUMENTS

2004/0197967 A1 10/2004 Chen
2018/0145094 A1* 5/2018 Yan .................. H01L 29/78696
(Continued)

FOREIGN PATENT DOCUMENTS

CN 106128961 A 11/2016
CN 106972033 A 7/2017
(Continued)

OTHER PUBLICATIONS

Notice of Reasons for Refusal dated Jun. 10, 2025, issued in counterpart JP Application No. 2023-580580, with English translation. (22 pages).

*Primary Examiner* — Kretelia Graham
*Assistant Examiner* — William Henry Anderson
(74) *Attorney, Agent, or Firm* — WHDA, LLP

(57) ABSTRACT

A displaying base plate and a manufacturing method thereof, and a displaying device. The displaying base plate includes an active area and a non-active area located at the periphery of the active area, wherein the active area includes an opening area and a non-opening area. The displaying base plate includes a substrate and a thin-film transistor disposed on one side of the substrate, wherein the thin-film transistor includes a grid electrode, an active layer, a source-drain electrode and an auxiliary film layer, an excavation area is disposed on the auxiliary film layer, and an orthographic projection of the excavation area on the substrate at least partially covers the opening area.

11 Claims, 9 Drawing Sheets

(56) References Cited

U.S. PATENT DOCUMENTS

| | | | | |
|---|---|---|---|---|
| 2019/0197950 | A1* | 6/2019 | Shibusawa | G09G 3/3233 |
| 2021/0104705 | A1 | 4/2021 | Kim et al. | |
| 2021/0133418 | A1 | 5/2021 | Liu et al. | |
| 2021/0143231 | A1* | 5/2021 | Chae | G09G 3/3233 |
| 2021/0231990 | A1 | 7/2021 | Shu et al. | |
| 2022/0199729 | A1* | 6/2022 | Yun | H10D 86/60 |
| 2022/0208909 | A1* | 6/2022 | Jeon | G09F 9/3026 |
| 2022/0209068 | A1* | 6/2022 | So | H10K 59/60 |
| 2022/0399407 | A1* | 12/2022 | Cha | H10K 59/121 |

FOREIGN PATENT DOCUMENTS

| | | | |
|---|---|---|---|
| CN | 109003989 | A | 12/2018 |
| CN | 109935631 | A | 6/2019 |
| CN | 110137184 | A | 8/2019 |
| CN | 110299322 | A | 10/2019 |
| CN | 110750020 | A | 2/2020 |
| CN | 112599565 | A | 4/2021 |
| CN | 112965310 | A | 6/2021 |
| JP | H04-152574 | A | 5/1992 |
| JP | 2003177427 | A | 6/2003 |
| JP | 2008-197359 | A | 8/2008 |
| JP | 2009-003187 | A | 1/2009 |
| JP | 2010-204536 | A | 9/2010 |
| WO | 2017/159413 | A1 | 9/2017 |

* cited by examiner

DISPLAYING BASE PLATE AND MANUFACTURING METHOD THEREOF, AND DISPLAYING DEVICE

TECHNICAL FIELD

The present disclosure relates to the technical field of displaying, and particularly relates to a displaying base plate and a manufacturing method thereof, and a displaying device.

BACKGROUND

With the popularization of a high-resolution displaying product and the increment of market demands of Virtual Reality (VR), the displaying effect of the high-resolution displaying product has become an emphasis of research. At present, the high-resolution displaying product has suffered from a common problem about lower transmittance.

SUMMARY

The present disclosure provides a displaying base plate, wherein the displaying base plate has an active area and a non-active area located at the periphery of the active area, the active area includes an opening area and a non-opening area, and the displaying base plate includes:

a substrate and a thin-film transistor disposed at one side of the substrate, wherein the thin-film transistor includes a grid, an active layer, a source-drain electrode and an auxiliary film layer, an excavation area is disposed on the auxiliary film layer, and an orthographic projection of the excavation area on the substrate at least partially covers the opening area.

In an optional embodiment, an orthographic projection of the auxiliary film layer on the substrate does not overlap with the opening area.

In an optional embodiment, the thin-film transistor comprises a first thin-film transistor located in the active area, the first thin-film transistor comprises a first active layer, a first grid insulating layer, a first grid electrode, a first interlayer dielectric layer and a first source electrode that are arranged in layer configuration, and the first active layer is disposed close to the substrate; and the auxiliary film layer comprises the first grid insulating layer and the first interlayer dielectric layer.

In an optional embodiment, the first thin-film transistor further comprises a barrier layer and a second interlayer dielectric layer that are disposed between the substrate and the first active layer, and the first active layer is disposed on the side, away from the substrate, of the second interlayer dielectric layer; and the auxiliary film layer further comprises the second interlayer dielectric layer.

In an optional embodiment, the thin-film transistor comprises a first thin-film transistor located in the active area and a second thin-film transistor located in the non-active area, and the first active layer of the first thin-film transistor is made of a material comprising a metal oxide;

the second thin-film transistor comprises a buffer layer, a second active layer, a second grid insulating layer and a second grid electrode that are arranged in layer configuration on the substrate, the second active layer is disposed close to the substrate; the first thin-film transistor is located on the side, away from the substrate, of the second grid electrode, and the second active layer is made of a material comprising polycrystalline silicon; and the auxiliary film layer comprises the buffer layer and the second grid insulating layer, and an orthographic projection of excavation areas of the buffer layer and an orthographic projection of the second grid insulating layer on the substrate at least partially cover the active area.

In an optional embodiment, a first planarization layer is formed on the side, away from the substrate, of the first thin-film transistor; and the first planarization layer is disposed with a step part on the edges, close to the active area, of the buffer layer and the second grid insulating layer, and a thickness of the step part close to a side of the non-active area is smaller than a thickness of the step part close to a side of the active area.

In an optional embodiment, a first passivation layer and a first transparent electrode layer are further arranged in layer configuration on the side, away from the substrate, of the first source electrode, and the first passivation layer is disposed close to the substrate;

the first transparent electrode layer comprises a first transferring electrode, and the first transferring electrode and a drain contacting area of the first active layer are connected by via holes disposed in the first passivation layer, the first interlayer dielectric layer and the first grid insulating layer; and the auxiliary film layer further comprises the first passivation layer.

In an optional embodiment, a first drain electrode is further disposed on the side, away from the substrate, of the first interlayer dielectric layer, and the first drain electrode and the first source electrode are disposed on the same layer; and a first transparent electrode layer is further disposed on the side, away from the substrate, of the first drain electrode, the first transparent electrode layer comprises a first transferring electrode, the first transferring electrode is contact connected with the first drain electrode, and the first drain electrode and the drain contacting area of the first active layer are connected by via holes disposed in the first interlayer dielectric layer and the first grid insulating layer.

In an optional embodiment, the first transparent electrode layer further comprises a second transferring electrode integrated with the first transferring electrode, and the second transferring electrode is located in the non-opening area;

a second planarization layer is disposed on the side, away from the substrate, of the first transparent electrode layer, a first through hole is disposed in the second planarization layer, and the first through hole penetrates through the second planarization layer to expose the second transferring electrode; and a second transparent electrode layer, a third planarization layer and a pixel-electrode layer are arranged in layer configuration on the side, away from the substrate, of the second planarization layer, wherein the second transparent electrode layer is disposed close to the substrate, an orthographic projection of the second transparent electrode layer on the substrate covers an orthographic projection of the first through hole on the substrate, the second transparent electrode layer is used for connecting the pixel-electrode layer and the second transferring electrode, and the third planarization layer is configured for planarizing the first through hole.

In an optional embodiment, a second passivation layer and a third transparent electrode layer are arranged in layer configuration on the side, away from the substrate, of the first transparent electrode laver, the second passivation layer is disposed close to the substrate, the third transparent electrode layer is connected with a first constant-electric-potential input terminal, and an orthographic projection of the third transparent electrode layer on the substrate overlaps with an orthographic projection of the first transparent electrode layer on the substrate.

In an optional embodiment, a third passivation layer and a data line are arranged in layer configuration on the side, away from the substrate, of the third transparent electrode layer, the third passivation layer is disposed close to the substrate, the data line and the first source electrode are connected by via holes disposed in the third passivation layer and the second passivation layer, the first source electrode and a source contacting area of the first active layer are connected by via holes disposed in the first grid insulating layer and the first interlayer dielectric layer, and an orthographic projection of the data line on the substrate covers an orthographic projection of the first active layer, an orthographic projection of the first source electrode and an orthographic projection of the first drain electrode on the substrate.

In an optional embodiment, the first active layer is made of a material comprising a metal oxide, the first active layer comprises a drain contacting area, and the drain contacting area is located in the opening area.

In an optional embodiment, an orthographic projection of the auxiliary film layer on the substrate does not overlap with the opening area, a fourth planarization layer is disposed on the side, away from the substrate, of the drain contacting area, a second through hole is disposed in the fourth planarization layer, and the second through hole penetrates through the fourth planarization layer to expose the drain contacting area; and a fourth transparent electrode layer, a fifth planarization layer and a pixel-electrode layer are arranged in layer configuration on the side, away from the substrate, of the fourth planarization layer, wherein the fourth transparent electrode layer is disposed close to the substrate, an orthographic projection of the fourth transparent electrode layer on the substrate covers an orthographic projection of the second through hole on the substrate, the fourth transparent electrode layer is configured for connecting the pixel-electrode layer and the drain contacting area, and the fifth planarization layer is configured for planarizing the second through hole.

In an optional embodiment, an orthographic projection of the auxiliary film layer on the substrate does not overlap with the opening area, a pixel-electrode layer is disposed on the side, away from the substrate, of the drain contacting area, and the pixel-electrode layer is in contact connection with the drain contacting area.

In an optional embodiment, a fourth passivation layer and a common-electrode layer are arranged in layer configuration on the side, away from the substrate, of the pixel-electrode layer, and the fourth passivation layer is disposed close to the substrate, wherein the common-electrode layer comprises a plurality of strip electrodes, and the common-electrode layer is made of a metal.

In an optional embodiment, the active area further comprises a data line and a scanning line, the first source electrode extends in a first direction to form the data line, the first grid electrode extends in a second direction intersecting with the first direction to form the scanning line, and both of an orthographic projection of the data line and an orthographic projection of the scanning line on the substrate cover an orthographic projection of a channel area of the first active layer on the substrate.

In an optional embodiment, the first active layer is made of a material comprising polycrystalline silicon, and an orthographic projection of the data line on the substrate covers an orthographic projection of the first active layer on the substrate.

In an optional embodiment, the channel area of the first active layer comprises a first channel area, a first resistor area and a second channel area that are sequentially disposed in the first direction, the first grid electrode comprises a first sub-grid electrode and a second sub-grid electrode that are disposed, respectively, an orthographic projection of the first sub-grid electrode on the substrate covers an orthographic projection of the first channel area on the substrate, and an orthographic projection of the second sub-grid electrode on the substrate covers an orthographic projection of the second channel area on the substrate.

In an optional embodiment, an orthographic projection of the barrier layer on the substrate covers the orthographic projection of the channel area of the first active layer on the substrate.

In an optional embodiment, the active area further comprises a data line and a scanning line, and the orthographic projection of the barrier layer on the substrate covers both of an orthographic projection of the data line and an orthographic projection of the scanning line on the substrate.

In an optional embodiment, wherein the barrier layer is connected with a second constant-electric-potential input terminal.

In an optional embodiment, the barrier layer and the first source electrode are connected by via holes disposed in the second interlayer dielectric layer, the first grid insulating layer and the first interlayer dielectric layer.

In an optional embodiment, the barrier layer is made of a material comprising at least one of molybdenum, aluminum and silver.

The present disclosure provides a displaying device including the displaying base plate according to any one of the embodiments.

The present disclosure provides a manufacturing method of a displaying base plate, wherein the displaying base plate includes an active area and a non-active area located at the periphery of the active area, the active area includes an opening area and a non-opening area, and the manufacturing method includes:

providing a substrate; and manufacturing a thin-film transistor on one side of the substrate, wherein the thin-film transistor includes a grid electrode, an active layer, a source-drain electrode and an auxiliary film layer, an excavation area is disposed on the auxiliary film layer, and an orthographic projection of the excavation area on the substrate at least partially covers the opening area.

In an optional embodiment, the thin-film transistor includes a first thin-film transistor located in the active area, and the step of manufacturing the thin-film transistor on one side of the substrate includes:

in the active area, sequentially forming a first active layer, a first grid insulating layer, a first grid electrode, a first interlayer dielectric layer and a first source electrode at one side of the substrate to obtain the first thin-film transistor, wherein the auxiliary film layer includes the first grid insulating layer and the first interlayer dielectric layer.

In an optional embodiment, the thin-film transistor includes the first thin-film transistor located in the active area and a second thin-film transistor located in the non-active area, the first active layer of the first thin-film transistor is made of a material including a metal oxide, a second active layer of the second thin-film transistor is made of a material including polycrystalline silicon, and the step of manufacturing the thin-film transistor on one side of the substrate includes:

in the non-active area, sequentially forming a buffer layer, the second active layer, a second grid insulating layer and a second grid electrode on one side of the substrate to obtain the second thin-film transistor, wherein the auxiliary film layer includes the buffer layer and the second grid insulating layer, and an orthographic projection of the excavation areas of the buffer layer and an orthographic projection of the second grid insulating layer on the substrate at least partially cover the active area; and in the active area, forming the first thin-film transistor on the side, away from the substrate, of the second grid electrode.

The above description is merely a summary of the technical solutions of the present disclosure. In order to more clearly know the technical means of the present disclosure to enable the implementation according to the contents of the description, and in order to make the above and other objectives, features and advantages of the present disclosure more apparent and understandable, the specific implementations of the present disclosure are provided below.

BRIEF DESCRIPTION OF THE DRAWINGS

In order to more clearly illustrate the technical solutions in the embodiments of the present disclosure or the related art, the drawings that are required to describe the embodiments or the related art will be briefly introduced below. Apparently, the drawings that are described below are some embodiments of the present disclosure, and the ordinary skill in the art may obtain other drawings according to these drawings without paying creative work. It should be noted that the proportions in the drawings are merely illustrative and do not indicate the actual proportions.

DETAILED DESCRIPTION OF THE EMBODIMENTS

Figure 1:
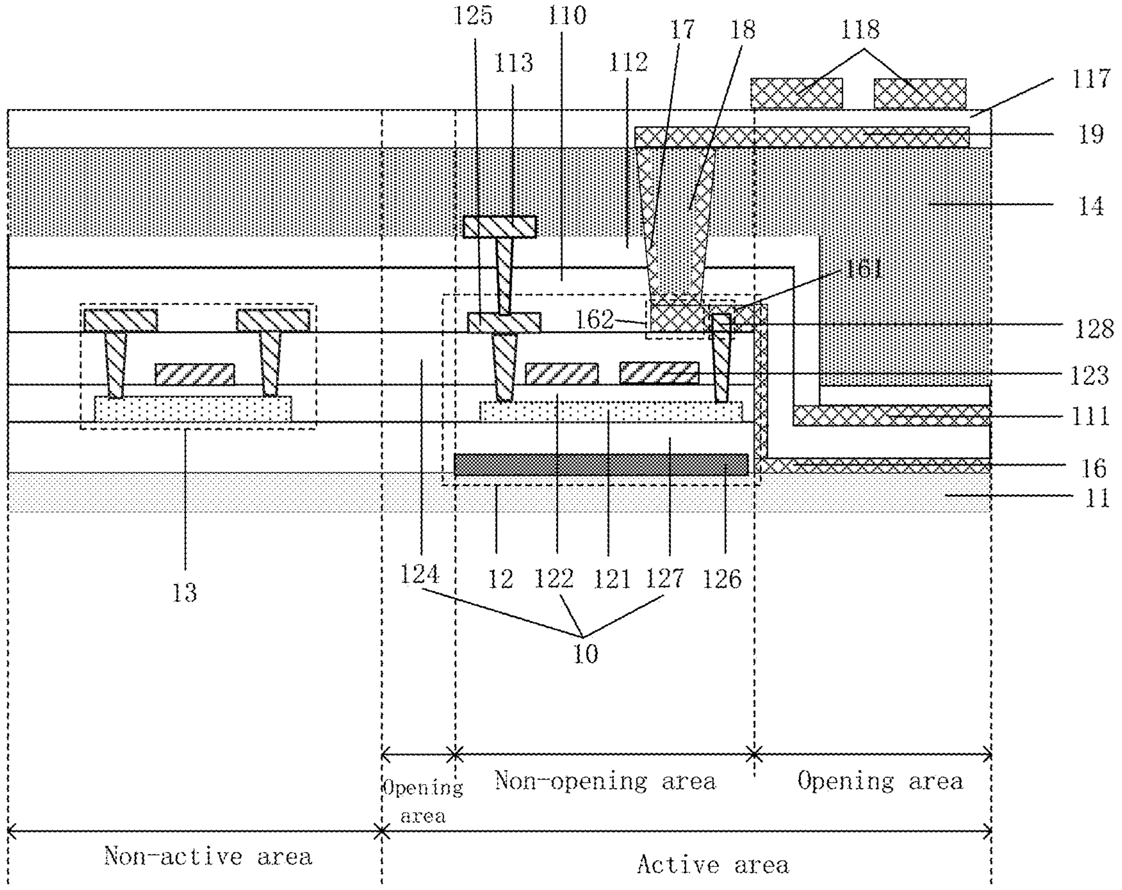
FIG. 1 shows a schematic sectional structural diagram of a displaying base plate according to an embodiment of the present disclosure.

In order to make the objectives, the technical solutions and the advantages of the embodiments of the present disclosure clearer, the technical solutions in the embodiments of the present disclosure will be clearly and completely described below with reference to the drawings in the embodiments of the present disclosure. Apparently, the described embodiments are merely certain embodiments of the present disclosure, rather than all of the embodiments. All of the other embodiments that the ordinary skill in the art obtains on the basis of the embodiments of the present disclosure without paying creative work fall within the protection scope of the present disclosure.

An embodiment of the present disclosure provides a displaying base plate. Referring to FIGS. 1 to 4, the displaying base plate includes an active area and a non-active area located at the periphery of the active area, and the active area includes an opening area and a non-opening area.

Referring to FIGS. 1 to 4, the displaying base plate includes: a substrate 11 and a thin-film transistor disposed on one side of the substrate 11, wherein the thin-film transistor includes a grid electrode, an active layer, a source-drain electrode and an auxiliary film layer 10, an excavation area is disposed on the auxiliary film layer 10, and an orthographic projection of the excavation area on the substrate 11 at least partially covers the opening area.

In the present embodiment, the auxiliary film layer 10 may include at least one of the following inorganic film layers: a buffer layer, an insulating layer, an interlayer dielectric layer, a passivation layer and so on, and may also include an organic film layer such as a planarization layer, which is not limited in the present embodiment. The structure of the auxiliary film layer will be introduced in detail in combination with a specific structure of the thin-film transistor in the subsequent embodiments.

In a specific implementation, the excavation area may be formed by etching the auxiliary film layer in the opening area, which is not limited in the present embodiment.

In the present embodiment, the excavation area on the auxiliary film layer 10 overlaps with the opening area. By excavating out the auxiliary film layer in the opening area, a thickness of the film layer in the opening area may be reduced, the number of film layer interfaces may be reduced, and thus, the transmittance of light rays in the opening area may be increased.

The inventor has performed simulation calculation on the transmittance of the displaying base plate provided by the present embodiment. Found by a simulation result, by disposing the excavation area on the auxiliary film layer, the average transmittance of a visible light waveband may be increased by 21%, and the average transmittance of a 550 nm waveband may be increased by 16%. It should be noted that the simulation result is related to the specific structure of the displaying base plate. The numerical value that the transmittance is increased is not limited in the present embodiment.

According to the displaying base plate provided by the present embodiment, by disposing the excavation area on the auxiliary film layer in the opening area, the transmittance of the opening area may be greatly increased.

In a direction perpendicular to a plane where the displaying base plate is located, the excavation area may completely or partially penetrate through the auxiliary film layer 10, which is not limited in the present embodiment. When the excavation area completely penetrates through the auxiliary film layer 10, the transmittance of the opening area may be further increased.

In the present embodiment, the thin-film transistor may be of a top-grid structure (shown in FIGS. 1 to 4), and may also be of a bottom-grid structure, which is not limited in the present embodiment. The grid electrode in the thin-film transistor may be of a single-grid structure (shown in FIGS. 2 to 4), a double-grid structure (shown in FIG. 1) or a multi-grid structure and so on, which is not limited in the present embodiment.

The active layer may be made of a material including amorphous silicon, polycrystalline silicon, a metal oxide and so on, which is not limited in the present embodiment. The active layer may include a source contacting area, a drain contacting area and a channel area disposed between the source contacting area and the drain contacting area.

The source-drain electrode may, for example, include a source electrode and a drain electrode, wherein the source electrode is connected with the source contacting area of the active layer, and the drain is connected with the drain contacting area of the active layer.

In an optional implementation, an orthographic projection of the auxiliary film layer 10 on the substrate 11 may not overlap with the opening area. That is, an orthographic projection of the excavation area on the substrate 11 entirely covers the opening area, or the orthographic projection of the excavation area on the substrate 11 entirely overlaps with the opening area. In the present embodiment, by excavating out the auxiliary film layer 10 in the opening area within the maximum range, the transmittance of the opening area may be further increased.

In an optional implementation, referring to FIGS. 1 to 4, the thin-film transistor may include a first thin-film transistor 12 located in the active area, the first thin-film transistor 12 may include a first active layer 121, a first grid insulating layer 122 and a first grid electrode 123 that are arranged in layer configuration, and the auxiliary film layer 10 may include the first grid insulating layer 122.

The first active layer 121 may be disposed close to the substrate 11, that is, the first thin-film transistor 12 is of the top-grid structure. In the present implementation, the first thin-film transistor 12 is of the top-grid structure. As compared with conventional bottom-grid structures, the first grid electrode 123 does not require the shielding of a backlight, so that the size may be reduced, and accordingly, the parasitic capacitance formed between the first grid electrode 123 and the other film layers may be reduced, to reduce the power consumption.

Optionally, referring to FIGS. 1 to 4, the first thin-film transistor 12 may further include a first interlayer dielectric layer 124 and a first source electrode 125 that are disposed on the side, away from the substrate 11, of the first grid electrode 123, and the first interlayer dielectric layer 124 is disposed close to the first grid electrode 123. In the present implementation, the auxiliary film layer 10 may further include the first interlayer dielectric layer 124.

Referring to FIGS. 1 to 4, the first thin-film transistor 12 is of the top-grid structure, in order to avoid affecting electrical properties of the first thin-film transistor 12 due to irradiation of the backlight to the first active layer 121, in an optional implementation, the first thin-film transistor 12 may further include a barrier layer 126 and a second interlayer dielectric layer 127 that are disposed between the substrate 11 and the first active layer 121, and the first active layer 121 is disposed on the side, away from the substrate 11, of the second interlayer dielectric layer 127. In the present implementation, the auxiliary film layer 10 may further include the second interlayer dielectric layer 127.

As for a displaying base plate in the related art, in order to ensure the circuit driving capability of the non-active area, the thin-film transistor located in the non-active area is generally formed by adopting a Low Temperature Poly-Silicon (LTPS) process; and meanwhile, in order to ensure a displaying effect in the active area, the thin-film transistor located in the active area is generally formed by adopting an indium gallium zinc oxide (IGZO) process, and the thin-film transistor formed by adopting the IGZO process may improve the voltage retention rate while reducing the drain current. However, such a structure causes superfluous film layers, such as the buffer layer and the grid insulating layer between the thin-film transistor in the active area and the substrate, which are formed in the LTPS process, but do not play any roles in the active area, and these film layers may reduce the transmittance of the active area.

In an optional implementation, the thin-film transistor includes a first thin-film transistor 12 located in the active area and a second thin-film transistor 13 located in the non-active area, the first active layer 121 of the first thin-film transistor 12 is made of a material including a metal oxide, and the second active layer 132 of the second active layer 13 is made of a material including polycrystalline silicon.

Figure 2:
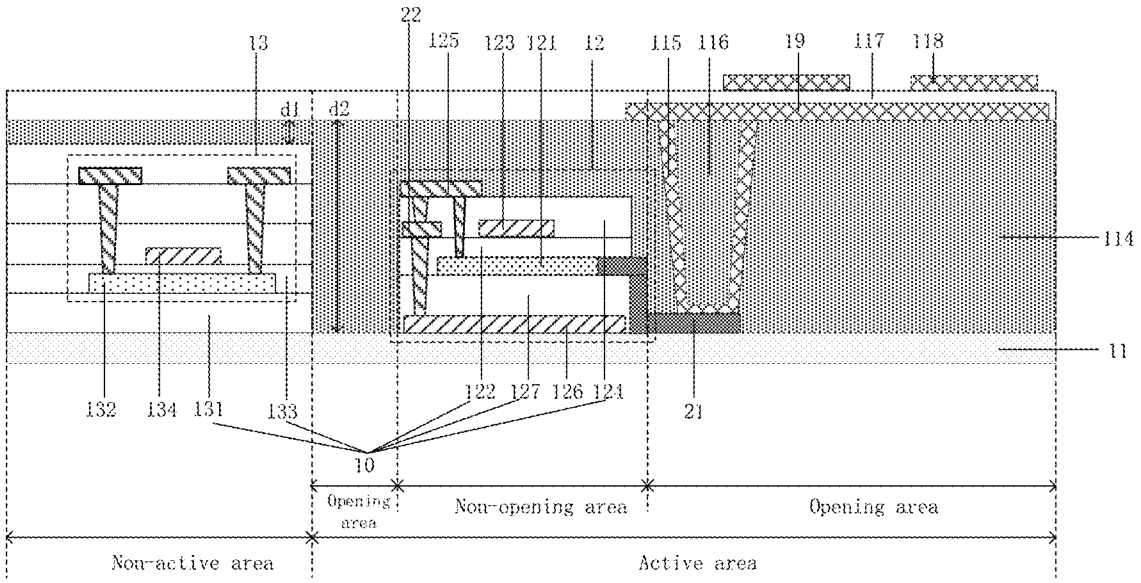
FIG. 2 shows a schematic sectional structural diagram of a displaying base plate according to an embodiment of the present disclosure.
Figure 3:
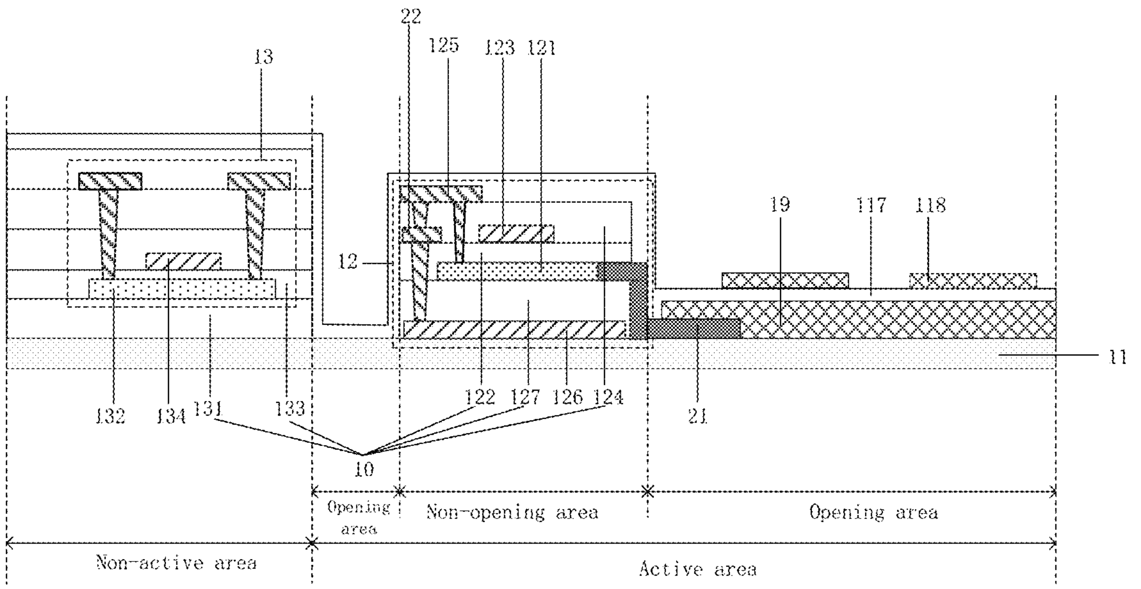
FIG. 3 shows a schematic sectional structural diagram of a displaying base plate according to an embodiment of the present disclosure.
Figure 4:
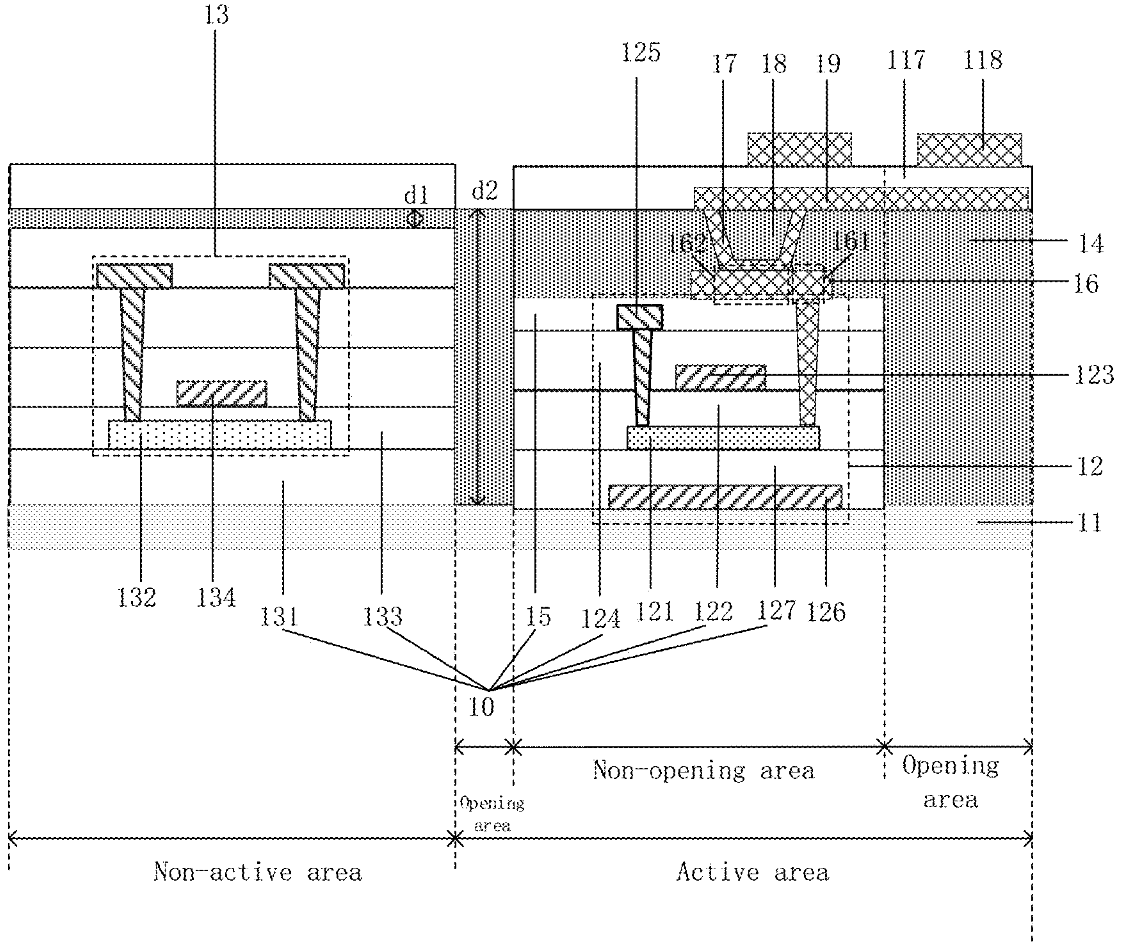
FIG. 4 shows a schematic sectional structural diagram of a displaying base plate according to an embodiment of the present disclosure.

Referring to FIGS. 2 to 4, the second thin-film transistor 13 may include a buffer layer 131, a second active layer 132, a second grid insulating layer 133 and a second grid electrode 134 that are arranged in layer configuration on the substrate 11; and the first thin-film transistor 12 is located on the side, away from the substrate 11, of the second grid electrode 134. The second active layer 132 may be disposed close to the substrate 11.

In the present implementation, the auxiliary film layer 10 may include the buffer layer 131 and the second grid insulating layer 133. An orthographic projection of the excavation areas of the buffer layer 131 and an orthographic projection of the second grid insulating layer 133 on the substrate 11 at least partially cover the active area (including the opening area and the non-opening area). That is, the orthographic projection of the excavation areas of the buffer layer 131 and the orthographic projection of the second grid insulating layer 133 on the substrate 11 overlap with the active area. In the present implementation, these superfluous film layers in the active area are removed, and thus, the transmittance of the active area may be increased.

In a specific implementation, referring to FIGS. 2 to 4, an orthographic projection of the buffer layer 131 on the substrate 11 may not overlap with the active area, and an orthographic projection of the second grid insulating layer 133 on the substrate 11 may not overlap with the active area. In this way, the transmittance of the active area may be further increased.

In an optional implementation, referring to FIGS. 2 and 4, a first planarization layer (114 in FIG. 2, 14 in FIG. 4) is formed on the side, away from the substrate 11, of the first thin-film transistor 12; and the first planarization layer (114 in FIG. 2, 14 in FIG. 4) is disposed with a step part on the edges, close to the active area, of the buffer layer 131 and the second grid insulating layer 133, namely a junction of the active area and the non-active area, and the thickness d1 of the step part close to the side of the non-active area is smaller than the thickness d2 of the step part close to the side of the active area.

In an optional implementation, referring to FIG. 4, a first passivation layer 15 and a first transparent electrode layer 16 are further arranged in layer configuration on the side, away from the substrate 11, of the first source electrode 125, and the first passivation layer 15 is disposed close to the substrate 11; wherein the first transparent electrode layer 16 includes a first transferring electrode 161, and the first transferring electrode 161 and a drain contacting area of the first active layer 121 are connected by via holes disposed in the first passivation layer 15, the first interlayer dielectric layer 124 and the first grid insulating layer 122. In the present implementation, the auxiliary film layer 10 may further include the first passivation layer 15.

In a specific implementation, referring to FIGS. 1 to 4, the auxiliary film layer 10 may include at least one of the following film layers: the first grid insulating layer 122, the first interlayer dielectric layer 124, the second interlayer dielectric layer 127, the buffer layer 131, the second grid insulating layer 133 and the first passivation layer 15.

In order to maximize the transmittance of the active area, referring to FIG. 1, the auxiliary film layer 10 includes the first grid insulating layer 122, the first interlayer dielectric layer 124 and the second interlayer dielectric layer 127, and the orthographic projection of the first grid insulating layer 122, the orthographic projection of the first interlayer dielectric layer 124 and the orthographic projection of the second interlayer dielectric layer 127 on the substrate 11 do not overlap with the opening area.

In order to maximize the transmittance of the active area, referring to FIGS. 2 and 3, the auxiliary film layer 10 includes the first grid insulating layer 122, the first interlayer dielectric layer 124, the second interlayer dielectric layer 127, the buffer layer 131 and the second grid insulating layer 133, wherein the orthographic projection of the first grid insulating layer 122, the orthographic projection of the first interlayer dielectric layer 124 and the orthographic projection of the second interlayer dielectric layer 127 on the substrate 11 do not overlap with the opening area, and the orthographic projection of the buffer layer 131 and the orthographic projection of the second grid insulating layer 133 on the substrate 11 do not overlap with the active area (including the opening area and the non-opening area).

In order to maximize the transmittance of the active area, referring to FIG. 4, the auxiliary film layer 10 includes the first grid insulating layer 122, the first interlayer dielectric layer 124, the second interlayer dielectric layer 127, the buffer layer 131, the second grid insulating layer 133 and the first passivation layer 15, wherein the orthographic projection of the first grid insulating layer 122, the orthographic projection of the first interlayer dielectric layer 124, the orthographic projection of the second interlayer dielectric layer 127 and the orthographic projection of the first passivation layer 15 on the substrate 11 do not overlap with the opening area, and the orthographic projection of the buffer layer 131 and the orthographic projection of the second grid insulating layer 133 on the substrate 11 do not overlap with the active area (including the opening area and the non-opening area).

In an optional implementation, referring to FIG. 1, a first drain electrode 128 is further disposed on the side, away from the substrate 11, of the first interlayer dielectric layer 124, and the first drain electrode 128 and the first source electrode 125 are disposed on the same layer; and a first transparent electrode layer 16 is further disposed on the side, away from the substrate 11, of the first drain electrode 128, the first transparent electrode layer 16 includes a first transferring electrode 161 in contact connection with the first drain electrode 128 (that is, overlapping), and the first drain electrode 128 and the drain contacting area of the first active layer 121 are connected by via holes disposed in the first interlayer dielectric layer 124 and the first grid insulating layer 122.

In the present implementation, the first drain electrode 128 may be made of a metal, and thus, the contact resistance between the first drain electrode 128 and the drain contacting area may be reduced.

In order not to occupy the opening area, the first drain electrode 128 made of the metal and the drain contacting area connected with the first drain electrode 128 may be located in the non-opening area, for example, they may be located within an area range corresponding to a data line, and thus, the aperture ratio may be increased.

The first transparent electrode layer 16 is made of a transparent conductive material, the transparent conductive material may include at least one of transparent metal oxides such as an Indium Tin Oxide (ITO), an Indium Zinc Oxide (IZO) and graphene oxide and so on.

Referring to FIGS. 1 and 4, the first transparent electrode layer 16 may further include a second transferring electrode 162 integrated with the first transferring electrode 161, and the second transferring electrode 162 is located in the non-opening area.

The second transferring electrode 162 is used to be connected with a pixel-electrode layer by a via hole. Since the second transferring electrode 162 is located in the non-opening area, a light shielding layer disposed for shielding light leakage on the position of the via hole may be omitted, and thus, the aperture ratio may be increased.

An orthographic projection of the via hole for connecting the first transferring electrode 161 or the first drain electrode 128 to the first active layer 121 on the substrate may not overlap with an orthographic projection of the via hole for connecting the second transferring electrode 162 to the pixel-electrode layer on the substrate. The first transparent electrode layer 16 functions as a transferring layer.

Through the integration of the first transferring electrode 161 and the second transferring electrode 162, the via hole for connecting the pixel-electrode layer may be transferred to an area where the continuous non-opening area is larger, and thus, a via hole with a larger size may be manufactured, the process difficulty may be lowered, and at the same time, the aperture ratio may not be affected. Through the first transparent electrode layer 16 having a transferring function, the problem of an insufficient tracing space caused by a smaller pixel space of a displaying base plate having a high pixel density may be solved.

In an optional implementation, referring to FIGS. 1 and 4, a second planarization layer 14 is disposed on the side, away from the substrate 11, of the first transparent electrode layer 16, a first through hole is disposed in the second planarization layer 14, and the first through hole penetrates through the second planarization layer 14 to expose the second transferring electrode 162. A second transparent electrode layer 17, a third planarization layer 18 and a pixel-electrode layer 19 are arranged in layer configuration on the side, away from the substrate 11, of the second planarization layer 14, wherein the second transparent electrode layer 17 is disposed close to the substrate 11, an orthographic projection of the second transparent electrode layer 17 on the substrate 11 covers an orthographic projection of the first through hole on the substrate 11, the second transparent electrode layer 17 is used for connecting the pixel-electrode layer 19 and the second transferring electrode 162, and the third planarization layer 18 is used for planarizing the first through hole.

The second transparent electrode layer 17 and the pixel-electrode layer 19 may, for example, be made of a transparent conductive material, which is not limited in the present embodiment.

In an aspect, the third planarization layer 18 disposed inside the first through hole fills and levels up the first through hole, which eliminates a deep-hole structure on the second planarization layer 14, and eliminates light leakage caused by the deep-hole structure, whereby it is not required to dispose a large light shielding layer to shield leaked light, which may increase the pixel aperture ratio of the active area.

In another aspect, since the pixel-electrode layer 19 is disposed on a flat surface, it may ensure that the distance between the pixel-electrode layer and the common-electrode layer is maintained to be constant, to enable the electric field to be uniform, and the liquid-crystal deflection to be normal, to prevent light leakage caused by abnormal liquid-crystal deflection, whereby it is not required to provide a large light shielding layer to shield leaked light, which may increase the pixel aperture ratio of the active area.

In addition, by disposing both of the second transparent electrode layer 17 and the pixel-electrode layer 19, respectively, the problem of high contact resistance when merely the second transparent electrode layer 17 is disposed may be solved. By overlapping one pixel-electrode layer 19 on the side, away from the substrate, of the third planarization layer 18, the problem of high contact resistance may be solved.

In an optional implementation, referring to FIG. 1, a second passivation layer 110 and a third transparent electrode layer 111 are arranged in layer configuration on the side, away from the substrate 11, of the first transparent electrode layer 16, the second passivation layer 110 is disposed close to the substrate 11, the third transparent electrode layer 111 is connected with a first constant-electric-potential input terminal, and an orthographic projection of the third transparent electrode layer 111 on the substrate 11 overlaps with an orthographic projection of the first transparent electrode layer 16 on the substrate 11. In the present implementation, the first through hole in the second planarization layer 14 further penetrates through the second passivation layer 110 to expose the second transferring electrode 162.

The third transparent electrode layer 111 may, for example, be made of a transparent conductive material, which is not limited in the present embodiment.

Since the orthographic projection of the third transparent electrode layer 111 and the orthographic projection of the first transparent electrode layer 16 on the substrate 11 overlap, storage capacitance may be formed. In this way, pixel storage capacitance not only includes first storage capacitance $C_{st1}$ formed between the pixel-electrode layer 19 and the common-electrode layer 118, but also includes second storage capacitance $C_{st2}$ formed between the third transparent electrode layer 111 and the first transparent electrode layer 16 and third storage capacitance $C_{st3}$ formed between the third transparent electrode layer 111 and the pixel-electrode layer 19, and total pixel storage capacitance is $C_{st1}+C_{st2}+C_{st3}$, which ensures that there is still sufficient storage capacitance in a smaller pixel space, increases the voltage retention rate, and ensures normal displaying. The voltage on the third transparent electrode layer 111 may, for example, be a common voltage.

In an optional implementation, referring to FIG. 1, a third passivation layer 112 and a data line 113 are arranged in layer configuration on the side, away from the substrate 11, of the third transparent electrode layer 111, the third passivation layer 112 is disposed close to the substrate 11, the data line 113 and the first source electrode 125 are connected by via holes disposed in the third passivation layer 112 and the second passivation layer 110, and the first source electrode 125 and a source contacting area of the first active layer 121 are connected by via holes disposed in the first grid insulating layer 122 and the first interlayer dielectric layer 124. In the present implementation, the first through hole in the second planarization layer 14 further penetrates through the third passivation layer 112 to expose the second transferring electrode 162.

In the present implementation, by disposing the third transparent electrode layer 111 between the data line 113 and the first transparent electrode layer 16, formation of coupling capacitance due to a too small distance between the data line 113 and the first transparent electrode layer 16 may be avoided. Since the third transparent electrode layer 111 is connected to a constant-electric-potential, even if a signal in the data line 113 varies at a high frequency, the influence of the signal in the data line 113 on the first transparent electrode layer 16 may be shielded, and then, the influence of the data line 113 on a pixel voltage on the pixel-electrode layer is shielded, thereby implementing the normal displaying of a pixel.

In the present implementation, the connection between the data line 113 and the source contacting area of the first active layer 121 may be achieved by the first source electrode 125, so that the difficulty of an aperturing process may be lowered, and the yield is increased.

The first source electrode 125 may be made of a metal. In order to avoid occupying the opening area, the orthographic projection of the first source electrode 125 and the orthographic projection of the source contacting area connected with the first source electrode 125 on the substrate may be located in an orthographic projection of the data line 113 on the substrate, and thus, the aperture ratio of the displaying base plate may be increased.

In a specific implementation, the first source electrode 125 and the first drain electrode 128 may be made of the same material, which is not limited in the present embodiment.

In an optional implementation, referring to FIGS. 2 and 3, the first active layer 121 is made of a material including a metal oxide, the first active layer 121 includes a drain contacting area 21, and the drain contacting area 21 is located in the opening area.

In the present implementation, in the opening area, the drain contacting area 21 and the pixel-electrode layer may be connected by a via hole without manufacturing a transferring electrode or the drain electrode, and therefore, the aperture ratio and the transmittance may be increased.

In an optional implementation, the source contacting area and the channel area of the first active layer 121 may be disposed in a first direction, and the orthographic projection of the source contacting area of the first active layer 121 and the orthographic projection of the channel area on the substrate 11 may be located in the orthographic projection of the data line 113 on the substrate 11. An orthographic projection of the drain contacting area 21 on the substrate 11 is located in the opening area to form an L-shaped active layer.

In an optional implementation, referring to FIG. 2, an orthographic projection of the auxiliary film layer 10 on the substrate 11 does not overlap with the opening area, a fourth planarization layer 114 is disposed on the side, away from the substrate 11, of the drain contacting area 21, a second through hole is disposed in the fourth planarization layer 114, and the second through hole penetrates through the fourth planarization layer 114 to expose the drain contacting area 21. In the present implementation, a fourth transparent electrode layer 115, a fifth planarization layer 116 and a pixel-electrode layer 19 are arranged in layer configuration on the side, away from the substrate 11, of the fourth planarization layer 114, wherein the fourth transparent electrode layer 115 is disposed close to the substrate 11, an orthographic projection of the fourth transparent electrode layer 115 on the substrate 11 covers an orthographic projection of the second through hole on the substrate 11, the fourth transparent electrode layer 115 is used for connecting the pixel-electrode layer 19 and the drain contacting area, and the fifth planarization layer 116 is used for planarizing the second through hole.

The fourth transparent electrode layer 115 may, for example, be made of a transparent conductive material, and the pixel-electrode layer 19 may, for example, be made of a transparent conductive material, which is not limited in the present embodiment.

In an aspect, the fifth planarization layer 116 disposed inside the second through hole fills and levels up the second through hole, which eliminates a deep-hole structure on the fourth planarization layer 114, and eliminates light leakage caused by the deep-hole structure, whereby it is not required to dispose a large light shielding layer to shield leaked light, which may increase the pixel aperture ratio of the active area.

In another aspect, since the pixel-electrode layer 19 is disposed on a flat surface, it may ensure that the distance between the pixel-electrode layer and the common-electrode layer is maintained to be constant, to enable the electric field to be uniform, and the liquid-crystal deflection to be normal, to prevent light leakage caused by abnormal liquid-crystal deflection, whereby it is not required to provide a large light shielding layer to shield leaked light, which may increase the pixel aperture ratio of the active area.

In addition, by disposing both of the fourth transparent electrode layer 115 and the pixel-electrode layer 19, respectively, the problem of high contact resistance when merely the fourth transparent electrode layer 115 is disposed may be solved. By overlapping one pixel-electrode layer 19 on the side, away from the substrate, of the fifth planarization layer 116, the problem of high contact resistance may be solved.

In an optional implementation, referring to FIG. 3, an orthographic projection of the auxiliary film layer 10 on the substrate 11 does not overlap with the opening area, a pixel-electrode layer 19 s disposed on the side, away from the substrate 11, of the drain contacting area 21, and a pixel-electrode layer 19 is in contact connection (namely overlapping) with the drain contacting area 21. Compared with a structure shown in FIG. 2, the structure in the present implementation is not provided with any planarization layers and via hole structures, and therefore, the process steps may be simplified, the yield may be increased, and the cost may be reduced. Moreover, due to the reduction of the number of film layers or film layer interfaces, the transmittance of the opening area may be further increased.

In order to form a horizontal electric field, in an optional implementation, referring to FIGS. 1 to 4, a fourth passivation layer 117 and a common-electrode layer 118 are arranged in layer configuration on the side, away from the substrate 11, of the pixel-electrode layer 19, and the fourth passivation layer 117 is disposed close to the substrate 11.

The common-electrode layer 118 may be made of a transparent conductive material or metal material, which is not limited in the present embodiment.

The common-electrode layer 118 may include a plurality of strip electrodes, and the plurality of strip electrodes may form a horizontal electric field with the pixel-electrode layer 19. The width and the spacing of the strip electrodes may be designed according to practical demands, which is not limited in the present embodiment. In order to reduce interference between light rays of neighboring pixels, the common-electrode layer 118 may be made of a metal.

Figure 5:
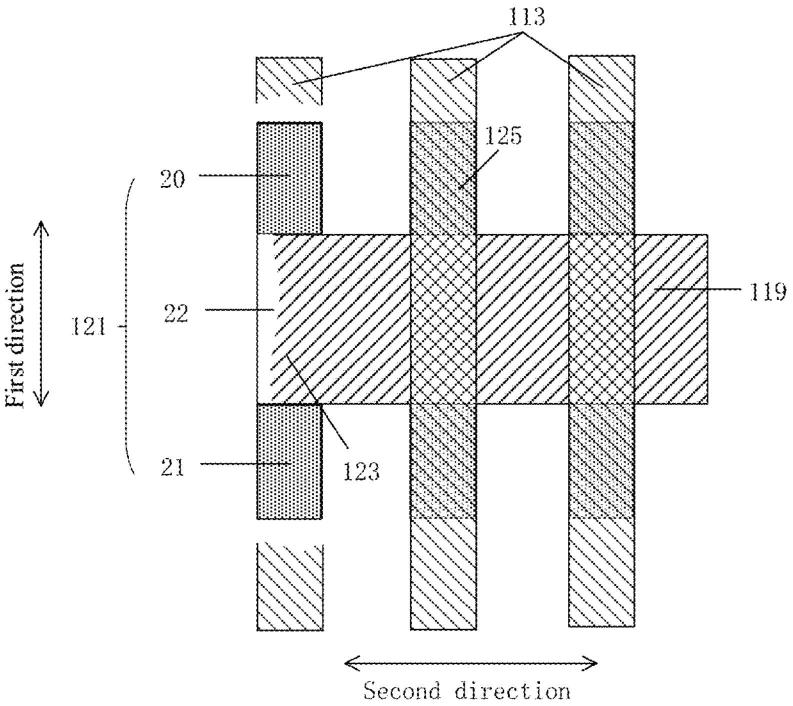
FIG. 5 shows a schematic planar structural diagram of a displaying base plate according to an embodiment of the present disclosure.

Referring to FIG. 5, the active area further includes a data line 113 and a scanning line 119, the data line 113 extends in a first direction, the first grid electrode 123 extends in a second direction intersecting with the first direction to form the scanning line 119, and both of the orthographic projection of the data line 113 and the orthographic projection of the scanning line 119 on the substrate 11 cover an orthographic projection of a channel area 22 of the first active layer 121 on the substrate 11.

It should be noted that, in order to clearly identify the first active layer 121, the scanning line 119 and the data line 113 at the left in FIG. 4 are not completely shown. The data line 113 may be formed by extending from the first source electrode 125 in the first direction, as shown in FIG. 5.

In an optional implementation, the first active layer 121 is made of a material including polycrystalline silicon, and an orthographic projection of the data line 113 on the substrate 11 may cover an orthographic projection of the first active layer 121 on the substrate 11, as shown in FIG. 5. That is, the orthographic projection of the data line 113 on the substrate 11 may cover the orthographic projection of the channel area 22, the orthographic projection of the source contacting area 20 and the orthographic projection of the drain contacting area 21 on the substrate 11. In the present implementation, the first active layer 121 may be prevented from occupying the opening area, and the aperture ratio may be increased.

Figure 6:
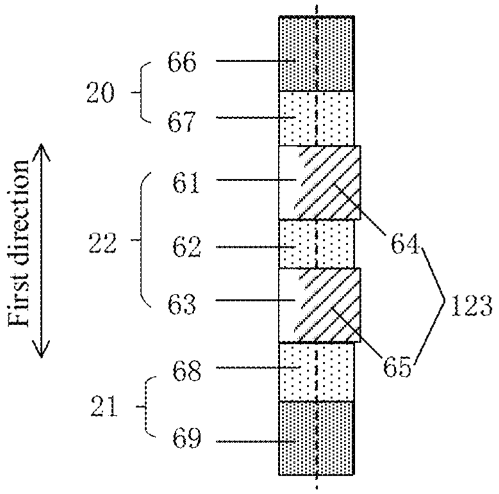
FIG. 6 shows a schematic planar structural diagram of a first thin-film transistor according to an embodiment of the present disclosure.
Figure 7:
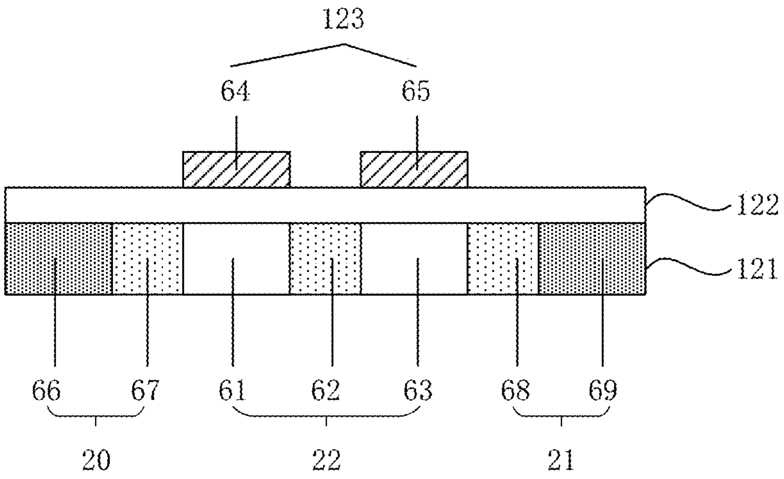
FIG. 7 shows a schematic sectional structural diagram of a first thin-film transistor according to an embodiment of the present disclosure.

In an optional implementation, referring to FIGS. 6 and 7, the channel area 22 of the first active layer 121 may include a first channel area 61, a first resistor area 62 and a second channel area 63 that are sequentially disposed in the first direction, the first grid electrode 123 includes a first sub-grid electrode 64 and a second sub-grid electrode 65 that are disposed, respectively, an orthographic projection of the first sub-grid electrode 64 on the substrate 11 covers an orthographic projection of the first channel area 61 on the substrate 11, and an orthographic projection of the second sub-grid electrode 65 on the substrate 11 covers an orthographic projection of the second channel area 63 on the substrate 11.

It should be noted that, in order to clearly identify the first active layer 121, the first sub-grid electrode 64 and the second sub-grid electrode 65 in FIG. 6 are not completely shown.

Referring to FIGS. 6 and 7, the first channel area 61, the first resistor area 62 and the second channel area 63 are sequentially disposed in the first direction to form an I-shaped channel. The first channel area 61 and the second channel area 63 may be equivalent to two thin-film-transistor switches that are connected in series, and the first resistor area 62 may be equivalent to a resistor that is connected in series between the two thin-film-transistor switches. The first resistor area 62 may be formed by performing processes such as ion doping and plasma treatment on the material of the first active layer 121.

In the present embodiment, by disposing the first resistor area 62 between the first channel area 61 and the second channel area 63, which is equivalent to connecting in series a resistor between two thin-film-transistor switches, the setting of the resistor may inhibit the generation of a leakage current, which may reduce the leakage current of the thin-film transistor, to improve the stability of a threshold voltage.

The first sub-grid electrode 64 is configured to receive a signal for controlling the first channel area 61 to turn on or turn off. The second sub-grid electrode 65 is configured to receive a signal for controlling the second channel area 63 to turn on or turn off. In an optional implementation, the signals received by the first sub-grid electrode 64 and the second sub-grid electrode 65 may be the same, which is not limited in the present embodiment.

In the present implementation, the first thin-film transistor is of a double-grid structure, which has higher electric stability and higher voltage retention rate, and therefore, the displaying effect and the reliability of the displaying base plate may be improved. In addition, the channel of the first thin-film transistor is the I-shaped channel, it occupies a smaller area in a pixel unit of the displaying base plate, which may increase the aperture ratio of the displaying base plate, and, especially, may obviously increase the aperture ratio of displaying base plates having high pixel densities. The displaying base plate may be applied to a Virtual Reality (VR) displaying technique, an Augmented Reality (AR) displaying technique and so on.

Referring to FIGS. 6 and 7, a source contacting area 20 may include a first conductor area 66 and a second resistor area 67, and the second resistor area 67 is disposed close to the first channel area 61. The drain contacting area 21 may include a second conductor area 69 and a third resistor area 68, and the third resistor area 68 is disposed close to the second channel area 63. By disposing the second resistor area 67 and the third resistor area 68, the leakage current may be further reduced.

In an optional implementation, referring to FIGS. 1 to 4, an orthographic projection of the barrier layer 126 on the substrate 11 covers the orthographic projection of the channel area of the first active layer 121 on the substrate 11.

Figure 8:
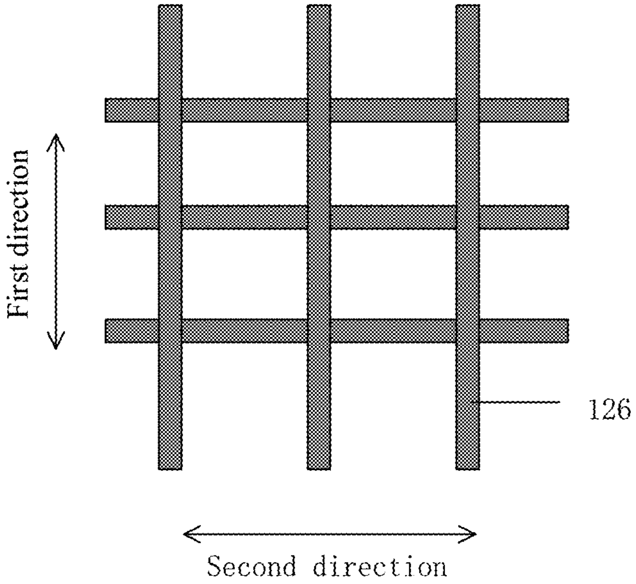
FIG. 8 shows a schematic planar structural diagram of a barrier layer according to an embodiment of the present disclosure.

In an optional implementation, referring to FIG. 8, the active area further includes a data line 113 and a scanning line 119, and the orthographic projection of the barrier layer 126 on the substrate 11 covers both of the orthographic projection of the data line 113 and the orthographic projection of the scanning line 119 on the substrate 11. That is, the barrier layer 126 is of a net-like structure. The barrier layer of the net-like structure may increase the area of the barrier layer without affecting the aperture ratio, and therefore may reflect more backlight, to increase the transmittance of the backlight.

In an optional implementation, the barrier layer 126 is connected with a second constant-electric-potential input terminal. The second constant-electric-potential input terminal may, for example, be a constant-electric-potential input terminal of a power voltage. The present implementation may prevent abnormal displaying caused by the drifting of the threshold voltage of the first thin-film transistor, to improve the uniformity of the displaying.

Referring to FIGS. 2 and 3, the barrier layer 126 and the first source electrode 125 are connected by via holes disposed in the second interlayer dielectric layer 127, the first grid insulating layer 122 and the first interlayer dielectric layer 124.

In order to further increase the utilization ratio of the backlight, the barrier layer 126 may be made of a metal material with high reflectivity. The metal material may include at least one of molybdenum, aluminum, silver and tin. By using the barrier layer made of the material with the high reflectivity, the backlight irradiating the barrier layer may be reflected back, and the reflected backlight may be utilized repeatedly, thereby increasing the transmittance of the backlight.

The barrier layer may, for example, be made of Al/top TIN, Al/top Mo, Al alloy/top TIN or Al alloy/top Mo. These materials have good high-temperature stability and stable and unchanged reflectivity before and after high-temperature annealing.

Another embodiment of the present disclosure further provides a displaying base plate. Referring to FIGS. 2 and 3, the displaying base plate includes an active area and a non-active area located at the periphery of the active area, and the active area includes an opening area and a non-opening area.

Referring to FIGS. 2 and 3, the displaying base plate includes a substrate 11 and a thin-film transistor 12 disposed on one side of the substrate 11, wherein the thin-film transistor 12 is located in the active area, the first thin-film transistor 12 includes a first active layer 121, a first grid insulating layer 122 and a first grid electrode 123 that are arranged in layer configuration, wherein the first active layer 121 is made of a metal oxide, the first active layer 121 includes a drain contacting area 21, and the drain contacting area 21 is located in the opening area.

As for the displaying base plate according to the present embodiment, since the drain contacting area 21 is located in the opening area, the drain contacting area 21 and the pixel-electrode layer in the opening area may be connected by a via hole without manufacturing a transferring electrode or a drain electrode, and therefore, the aperture ratio and the transmittance of the active area may be increased. Moreover, the first active layer 121 is made of a transparent metal oxide, and therefore, the aperture ratio and the transmittance of the active area may not be affected even if the first active layer is disposed in the opening area.

In the present embodiment, the thin-film transistor 12 may be of a top-grid structure (shown in FIGS. 2 and 3), and may also be of a bottom-grid structure, which is not limited in the present embodiment. The first grid electrode 123 may be of a single-grid structure (shown in FIGS. 2 and 3), a double-grid structure or a multi-grid structure and so on, which is not limited in the present embodiment.

The first active layer 121 further includes a source contacting area and a channel area. In an optional implementation, as shown in FIGS. 2 and 3, the source contacting area and the channel area may be located in the non-opening area, the source contacting area and the channel area of the first active layer 121 may be disposed in a first direction, and the orthographic projection of the source contacting area and the orthographic projection of the channel area of the first active layer 121 on the substrate 11 may be located in the orthographic projection of the data line 113 on the substrate 11. In the present implementation, the first active layer 121 is L-shaped.

In an optional implementation, referring to FIGS. 2 and 3, the displaying base plate further includes a second thin-film transistor 13 located in the non-active area, and the second thin-film transistor 13 may include a buffer layer 131, a second active layer 132, a second grid insulating layer 133 and a second grid electrode 134 that are arranged in layer configuration on the substrate 11; wherein the second active layer 132 may be disposed close to the substrate 11, and the second active layer 132 of the second thin-film transistor 13 may be made of a material including polycrystalline silicon; and the first thin-film transistor 12 is located on the side, away from the substrate 11, of the second grid electrode 134.

The second thin-film transistor 13 may be generally formed by adopting an indium gallium zinc oxide (IGZO) process, and thus, the circuit driving capability of the non-active area is improved. The first thin-film transistor 12 may be formed by adopting the indium gallium zinc oxide (IGZO) process, so that the voltage retention rate may be improved while the drain current is reduced, and a displaying effect in the active area is improved.

In an optional implementation, referring to FIG. 2, a fourth planarization layer 114 is disposed on the side, away from the substrate 11, of the first thin-film transistor 12, a second through hole is disposed in the fourth planarization layer 114, and the second through hole penetrates through the fourth planarization layer 114 to expose the drain contacting area 21. A fourth transparent electrode layer 115, a fifth planarization layer 116 and a pixel-electrode layer 19 are arranged in layer configuration on the side, away from the substrate 11, of the fourth planarization layer 114, wherein the fourth transparent electrode layer 115 is disposed close to the substrate 11, an orthographic projection of the fourth transparent electrode layer 115 on the substrate 11 covers an orthographic projection of the second through hole on the substrate 11, the fourth transparent electrode layer 115 is used for connecting the pixel-electrode layer 19 and the drain contacting area, and the fifth planarization layer 116 is used for planarizing the second through hole.

The fourth transparent electrode layer 115 may, for example, be made of a transparent conductive material, and the pixel-electrode layer 19 may, for example, be made of a transparent conductive material, which is not limited in the present embodiment.

In an aspect, the fifth planarization layer 116 disposed inside the second through hole fills and levels up the second through hole, which eliminates a deep-hole structure on the fourth planarization layer 114, and eliminates light leakage caused by the deep-hole structure, whereby it is not required to dispose a large light shielding layer to shield leaked light, which may increase the pixel aperture ratio of the active area.

In another aspect, since the pixel-electrode layer 19 is disposed on a flat surface, it may ensure that the distance between the pixel-electrode layer and the common-electrode layer is maintained to be constant, to enable the electric field to be uniform, and the liquid-crystal deflection to be normal, to prevent light leakage caused by abnormal liquid-crystal deflection, whereby it is not required to provide a large light shielding layer to shield leaked light, which may increase the pixel aperture ratio of the active area.

In addition, by disposing both of the fourth transparent electrode layer 115 and the pixel-electrode layer 19, respectively, the problem of high contact resistance when merely the fourth transparent electrode layer 115 is disposed may be solved. By overlapping one pixel-electrode layer 19 on the side, away from the substrate, of the fifth planarization layer 116, the problem of high contact resistance may be solved.

In an optional implementation, referring to FIG. 3, the pixel-electrode layer 19 is disposed on the side, away from the substrate 11, of the drain contacting area 21, and the pixel-electrode layer 19 is in contact connection (namely overlapping) with the drain contacting area 21. Compared with a structure shown in FIG. 2, the structure in the present implementation is not provided with any planarization layers and via hole structures, and therefore, the process steps may be simplified, the yield may be increased, and the cost may be reduced. Moreover, due to the reduction of the number of film layers or film layer interfaces, the transmittance of the opening area may be further increased.

In order to form a horizontal electric field, in an optional implementation, referring to FIGS. 2 and 3, a fourth passivation layer 117 and a common-electrode layer 118 are arranged in layer configuration on the side, away from the substrate 11, of the pixel-electrode layer 19, and the fourth passivation layer 117 is disposed close to the substrate 11.

The common-electrode layer 118 may be made of a transparent conductive material or metal material, which is not limited in the present embodiment.

The common-electrode layer 118 may include a plurality of strip electrodes, and the plurality of strip electrodes may form a horizontal electric field with the pixel-electrode layer 19. The width and the spacing of the strip electrodes may be designed according to practical demands, which is not limited in the present embodiment. In order to reduce interference between light rays of neighboring pixels, the common-electrode layer 118 may be made of a metal.

In an optional implementation, the first active layer 121 may be disposed close to the substrate 11, that is, the first thin-film transistor 12 is of the top-grid structure. In the present implementation, the first thin-film transistor 12 is of the top-grid structure. As compared with conventional bottom-grid structures, the first grid electrode 123 does not require the shielding of a backlight, so that the size may be reduced, and accordingly, the parasitic capacitance formed between the first grid electrode 123 and the other film layers may be reduced, to reduce the power consumption.

Optionally, referring to FIGS. 2 and 3, the first thin-film transistor 12 may further include a first interlayer dielectric layer 124 and a first source electrode 125 that are disposed on the side, away from the substrate 11, of the first grid electrode 123, and the first interlayer dielectric layer 124 is disposed close to the first grid electrode 123. The fourth planarization layer 114 is disposed on the side, away from the substrate 11, of the first source electrode 125.

Referring to FIGS. 2 and 3, the first thin-film transistor 12 is of the top-grid structure, in order to avoid affecting electrical properties of the first thin-film transistor 12 due to irradiation of the backlight to the first active layer 121, in an optional implementation, the first thin-film transistor 12 may further include a barrier layer 126 and a second interlayer dielectric layer 127 that are disposed between the substrate 11 and the first active layer 121, and the first active layer 121 is disposed on the side, away from the substrate 11, of the second interlayer dielectric layer 127.

In an optional implementation, referring to FIGS. 1 to 4, an orthographic projection of the barrier layer 126 on the substrate 11 covers an orthographic projection of the channel area of the first active layer 121 on the substrate 11.

In an optional implementation, referring to FIG. 8, the active area further includes a data line 113 and a scanning line 119, the orthographic projection of the barrier layer 126 on the substrate 11 covers both of the orthographic projection of the data line 113 and the orthographic projection of the scanning line 119 on the substrate 11. That is, the barrier layer 126 is of a net-like structure. The barrier layer 126 of the net-like structure may increase the area of the barrier layer without affecting the aperture ratio, and therefore may reflect more backlight, to increase the transmittance of the backlight.

In an optional implementation, the barrier layer 126 is connected with a second constant-electric-potential input terminal. The second constant-electric-potential input terminal may, for example, be a constant-electric-potential input terminal of a power voltage. The present implementation may prevent abnormal displaying caused by the drifting of the threshold voltage of the first thin-film transistor, to improve the uniformity of the displaying.

In an optional implementation, the barrier layer 126 may be connected with the first source electrode 125. Referring to FIGS. 2 and 3, the barrier layer 126 and the first source electrode 125 are connected by via holes disposed in the second interlayer dielectric layer 127, the first grid insulating layer 122 and the first interlayer dielectric layer 124. A transferring electrode 22 may be disposed on the side, away from the substrate, of the first active layer 121, the first source electrode 125 and the transferring electrode 22 are connected by a via hole disposed in the first interlayer dielectric layer 124, and the transferring electrode 22 and the barrier layer 126 are connected by via holes disposed in the second interlayer dielectric layer 127 and the first grid insulating layer 122.

The connection between the barrier layer 126 and the first source electrode 125 may be achieved by the transferring electrode 22, so that the difficulty of an aperturing process may be lowered.

In order to further increase the utilization ratio of the backlight, the barrier layer 126 may be made of a metal material with high reflectivity. The metal material may include at least one of molybdenum, aluminum, silver and tin. By using the barrier layer made of the material with the high reflectivity, the backlight irradiating the barrier layer may be reflected back, and the reflected backlight may be utilized repeatedly, thereby increasing the transmittance of the backlight.

The barrier layer 126 may, for example, be made of Al/top TIN. Al/top Mo, Al alloy/top TIN or Al alloy/top Mo. These materials have good high-temperature stability and stable and unchanged reflectivity before and after high-temperature annealing.

In order to increase the transmittance of the active area, referring to FIGS. 2 and 3, an excavation area is disposed on the auxiliary film layer 10 in the active area, and an orthographic projection of the excavation area on the substrate 11 at least partially covers the opening area. That is, the excavation area of the auxiliary film layer 10 overlaps with the opening area. By excavating out the auxiliary film layer in the opening area, the thickness of the film layer in the opening area may be reduced, the number of film layer interfaces may be reduced, and thus, the transmittance of light rays in the opening area may be increased.

Referring to FIGS. 2 and 3, the auxiliary film layer 10 may include at least one of the following film layers: the first grid insulating layer 122, the first interlayer dielectric layer 124, the second interlayer dielectric layer 127, the buffer layer 131 and the second grid insulating layer 133.

The inventor has performed simulation calculation on the transmittance of the displaying base plate according to the present embodiment. Found by a simulation result, by disposing the excavation area on the auxiliary film layer, the average transmittance of a visible light waveband may be increased by 21%, and the average transmittance of a 550 nm waveband may be increased by 16%. It should be noted that the simulation result is related to the specific structure of the displaying base plate. The numerical value that the transmittance is increased is not limited in the present embodiment.

In a direction perpendicular to a plane where the displaying base plate is located, the excavation area may completely or partially penetrate through the auxiliary film layer 10, which is not limited in the present embodiment. When the excavation area completely penetrates through the auxiliary film layer 10, the transmittance of the opening area may be further increased.

In a specific implementation, the excavation area may be formed by etching the auxiliary film layer in the opening area, which is not limited in the present embodiment.

In an optional implementation, an orthographic projection of the auxiliary film layer 10 on the substrate 11 may not overlap with the opening area. That is, an orthographic projection of the excavation area on the substrate 11 entirely covers the opening area, or the orthographic projection of the excavation area on the substrate 11 entirely overlaps with the opening area. In the present embodiment, by excavating out the auxiliary film layer 10 in the opening area within the maximum range, the transmittance of the opening area may be further increased.

In order to maximize the transmittance of the active area, referring to FIGS. 2 and 3, the auxiliary film layer 10 includes the first grid insulating layer 122, the first interlayer dielectric layer 124, the second interlayer dielectric layer 127, the buffer layer 131 and the second grid insulating layer 133, wherein the orthographic projection of the first grid insulating layer 122, the orthographic projection of the first interlayer dielectric layer 124 and the orthographic projection of the second interlayer dielectric layer 127 on the substrate 11 do not overlap with the opening area, and the orthographic projection of the buffer layer 131 and the orthographic projection of the second grid insulating layer 133 on the substrate 11 do not overlap with the active area (including the opening area and the non-opening area).

In an optional implementation, referring to FIG. 2, a first planarization layer 114 is formed on the side, away from the substrate 11, of the first thin-film transistor 12; and the first planarization layer 114 is disposed with a step part on the edges, close to the active area, of the buffer layer 131 and the second grid insulating layer 133, namely a junction of the active area and the non-active area, and the thickness d1 of the step part close to the side of the non-active area is smaller than the thickness d2 of the step part close to the side of the active area.

The first source electrode 125 may be made of a metal. In order not to occupy the opening area, the orthographic projection of the first source electrode 125 and the orthographic projection the source contacting area connected with the first source electrode 125 on the substrate may be located in the orthographic projection of the data line 113 on the substrate, and thus, the aperture ratio of the active area may be increased.

Referring to FIG. 5, the active area further includes a data line 113 and a scanning line 119, the data line 113 extends in a first direction, the first grid electrode 123 extends in a second direction intersecting with the first direction to form the scanning line 119, and the orthographic projection of the data line 113 and the orthographic projection of the scanning line 119 on the substrate 11 cover an orthographic projection of a channel area 22 of the first active layer 121 on the substrate 11.

It should be noted that, in order to clearly identify the first active layer 121, the scanning line 119 and the data line 113 at the left in FIG. 4 are not completely shown. The data line 113 may be formed by extending from the first source electrode 125 in the first direction, as shown in FIG. 5.

In an optional implementation, referring to FIGS. 6 and 7, the channel area 22 of the first active layer 121 may include a first channel area 61, a first resistor area 62 and a second channel area 63 that are sequentially disposed in the first direction, the first grid electrode 123 includes a first sub-grid electrode 64 and a second sub-grid electrode 65 that are disposed, respectively, an orthographic projection of the first sub-grid electrode 64 on the substrate 11 covers an orthographic projection of the first channel area 61 on the substrate 11, and an orthographic projection of the second sub-grid electrode 65 on the substrate 11 covers an orthographic projection of the second channel area 63 on the substrate 11.

It should be noted that, in order to clearly identify the first active layer 121, the first sub-grid electrode 64 and the second sub-grid electrode 65 in FIG. 6 are not completely shown.

Referring to FIGS. 6 and 7, the first channel area 61, the first resistor area 62 and the second channel area 63 are sequentially disposed in the first direction to form an I-shaped channel. The first channel area 61 and the second channel area 63 may be equivalent to two thin-film-transistor switches that are connected in series, and the first resistor area 62 may be equivalent to a resistor that is connected in series between the two thin-film-transistor switches. The first resistor area 62 may be formed by performing processes such as ion doping and plasma treatment on the material of the first active layer 121.

In the present embodiment, by disposing the first resistor area 62 between the first channel area 61 and the second channel area 63, which is equivalent to connecting in series a resistor between two thin-film-transistor switches, the setting of the resistor may inhibit the generation of a leakage current, which may reduce the leakage current of the thin-film transistor, to improve the stability of a threshold voltage.

The first sub-grid electrode 64 is configured to receive a signal for controlling the first channel area 61 to turn on or turn off. The second sub-grid electrode 65 is configured to receive a signal for controlling the second channel area 63 to turn on or turn off. In an optional implementation, the signals received by the first sub-grid electrode 64 and the second sub-grid electrode 65 may be the same, which is not limited in the present embodiment.

In the present implementation, the first thin-film transistor is of a double-grid structure, which has higher electric stability and higher voltage retention rate, and therefore, the displaying effect and the reliability of the displaying base plate may be improved. In addition, the channel of the first thin-film transistor is the I-shaped channel, it occupies a smaller area in a pixel unit of the displaying base plate, which may increase the aperture ratio of the displaying base plate, and, especially, may obviously increase the aperture ratio of displaying base plates having high pixel densities. The displaying base plate may be applied to a Virtual Reality (VR) displaying technique, an Augmented Reality (AR) displaying technique and so on.

Referring to FIGS. 6 and 7, a source contacting area 20 may include a first conductor area 66 and a second resistor area 67, and the second resistor area 67 is disposed close to the first channel area 61. The drain contacting area 21 may include a second conductor area 69 and a third resistor area 68, and the third resistor area 68 is disposed close to the second channel area 63. By disposing the second resistor area 67 and the third resistor area 68, the leakage current may be further reduced.

Another embodiment of the present disclosure provides a displaying device. The displaying device may include the displaying base plate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Another embodiment of the present disclosure further provides a manufacturing method of a displaying base plate, wherein the displaying base plate includes an active area and a non-active area located at the periphery of the active area, and the active area includes an opening area and a non-opening area. The manufacturing method includes:

step 11: a substrate is provided; and step 12: a thin-film transistor is manufactured on one side of the substrate, wherein the thin-film transistor includes a grid electrode, an active layer, a source-drain electrode and an auxiliary film layer, an excavation area is disposed on the auxiliary film layer, and an orthographic projection of the excavation area on the substrate at least partially covers the opening area.

By using the manufacturing method according to the present embodiment, the displaying base plate according to any one of the above embodiments may be manufactured.

In an optional implementation, the thin-film transistor includes a first thin-film transistor located in the active area, and the step 12 may include:

in the active area, a first active layer, a first grid insulating layer, a first grid electrode, a first interlayer dielectric layer and a first source electrode are sequentially formed on one side of the substrate to obtain the first thin-film transistor, wherein the auxiliary film layer includes the first grid insulating layer and the first interlayer dielectric layer.

In an optional implementation, the thin-film transistor includes a first thin-film transistor located in the active area and a second thin-film transistor located in the non-active area, the first active layer of the first thin-film transistor is made of a material including a metal oxide, a second active layer of the second thin-film transistor is made of a material including polycrystalline silicon, and the step 12 may include: in the non-active area, a buffer layer, the second active layer, a second grid insulating layer and a second grid electrode are sequentially formed on one side of the substrate to obtain the second thin-film transistor, wherein the auxiliary film layer includes the buffer layer and the second grid insulating layer, and the orthographic projection of the excavation areas of the buffer layer and the orthographic projection of the second grid insulating layer on the substrate at least partially cover the active area; and in the active area, the first thin-film transistor is formed on the side, away from the substrate, of the second grid electrode.

Figure 9:
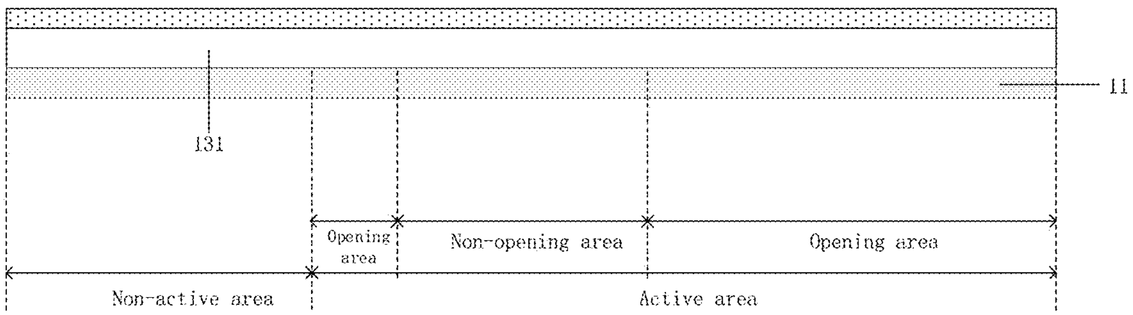
FIG. 9 shows a schematic sectional structural diagram of a displaying base plate when the materials of the buffer layer and the active layer are completely deposited according to an embodiment of the present disclosure.
Figure 10:
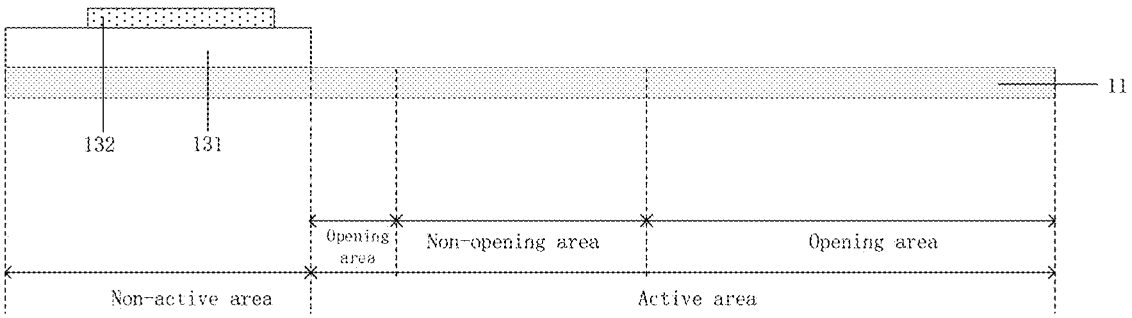
FIG. 10 shows a schematic sectional structural diagram of a displaying base plate when the second active layer and the buffer layer are completely manufactured according to an embodiment of the present disclosure.
Figure 11:
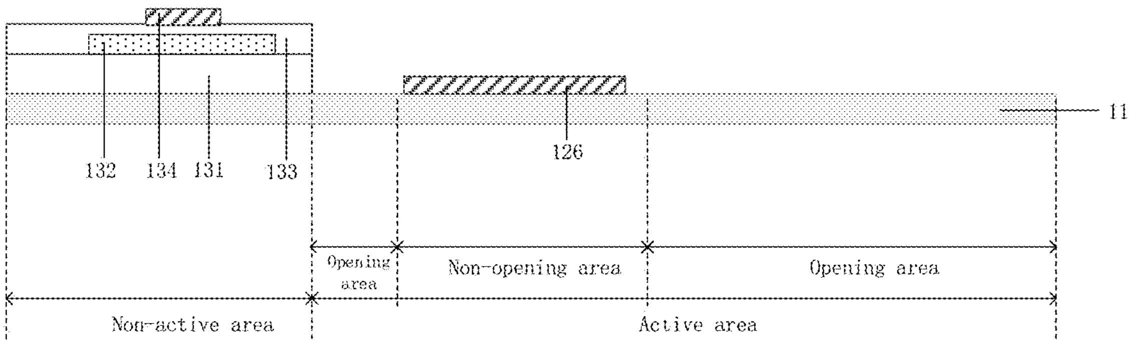
FIG. 11 shows a schematic sectional structural diagram of a displaying base plate when the second grid electrode and the barrier layer are completely manufactured according to an embodiment of the present disclosure.
Figure 12:
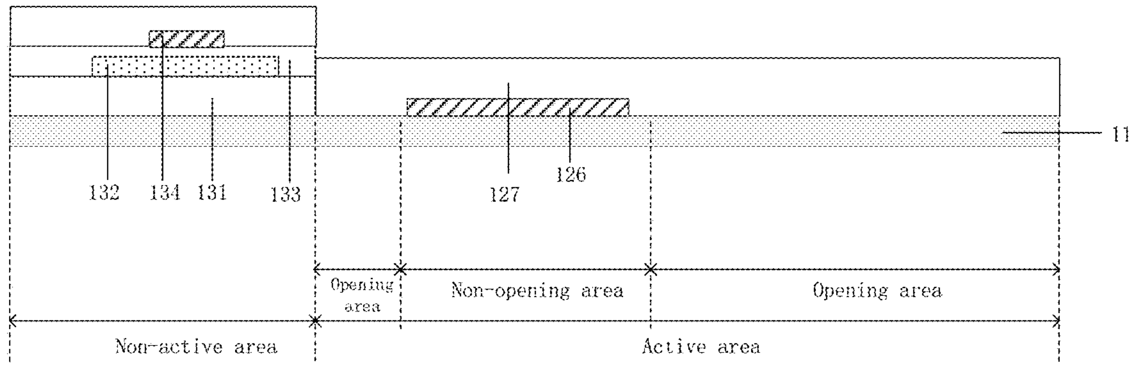
FIG. 12 shows a schematic sectional structural diagram of a displaying base plate when a material of the second interlayer dielectric layer is completely deposited according to an embodiment of the present disclosure.
Figure 13:
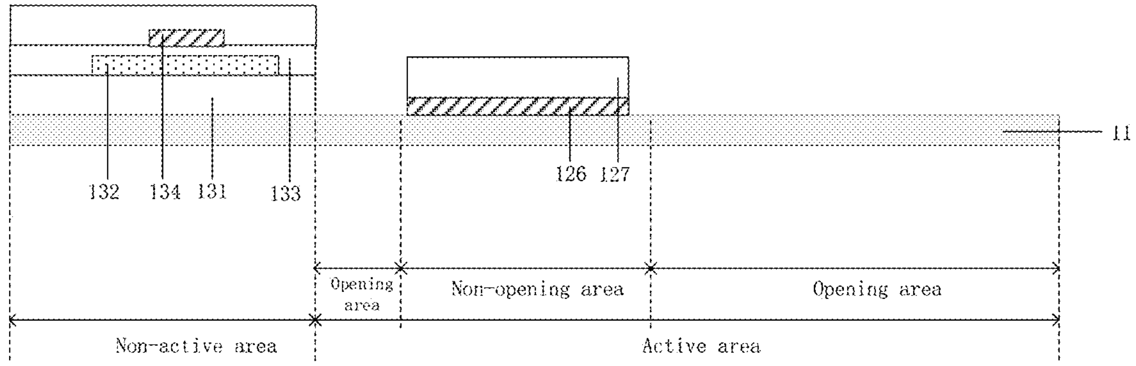
FIG. 13 shows a schematic sectional structural diagram of a displaying base plate when the second interlayer dielectric layer is completely manufactured according to an embodiment of the present disclosure.
Figure 14:
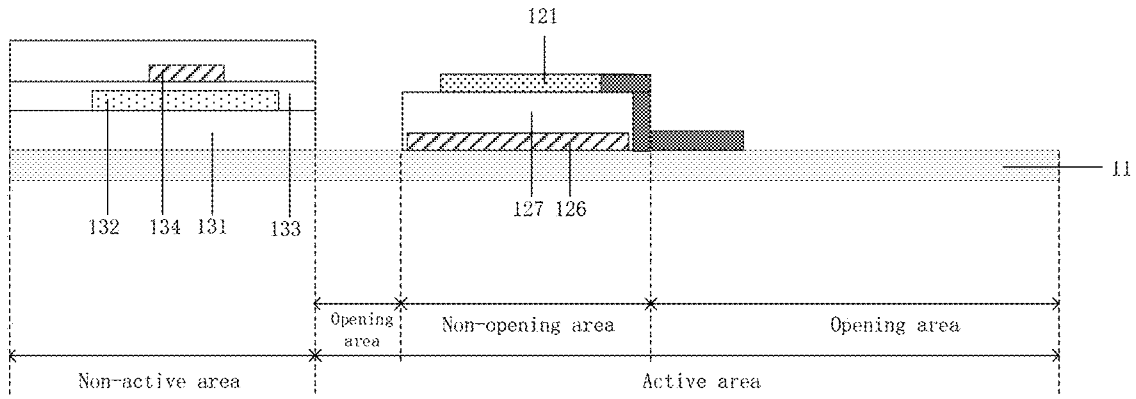
FIG. 14 shows a schematic sectional structural diagram of a displaying base plate when the first active layer is completely manufactured according to an embodiment of the present disclosure.
Figure 15:
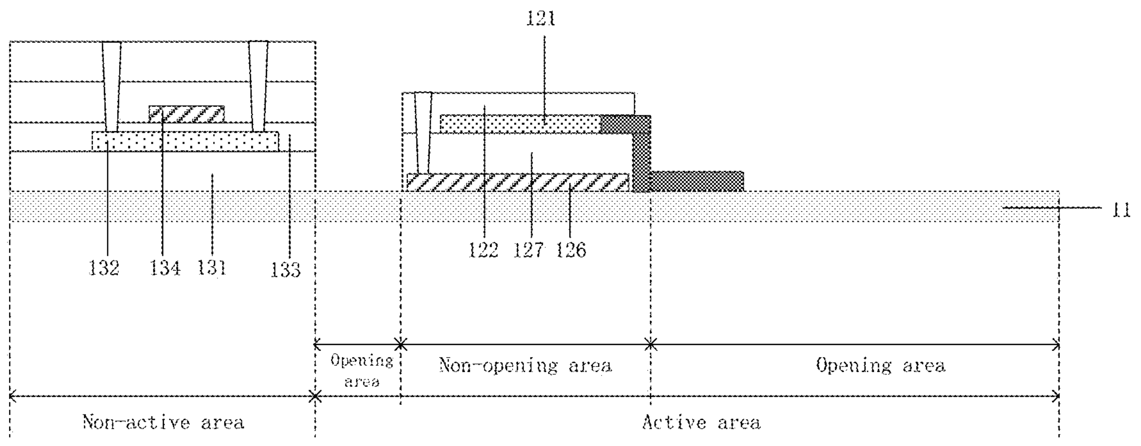
FIG. 15 shows a schematic sectional structural diagram of a displaying base plate when the first grid insulating layer is completely manufactured according to an embodiment of the present disclosure.
Figure 16:
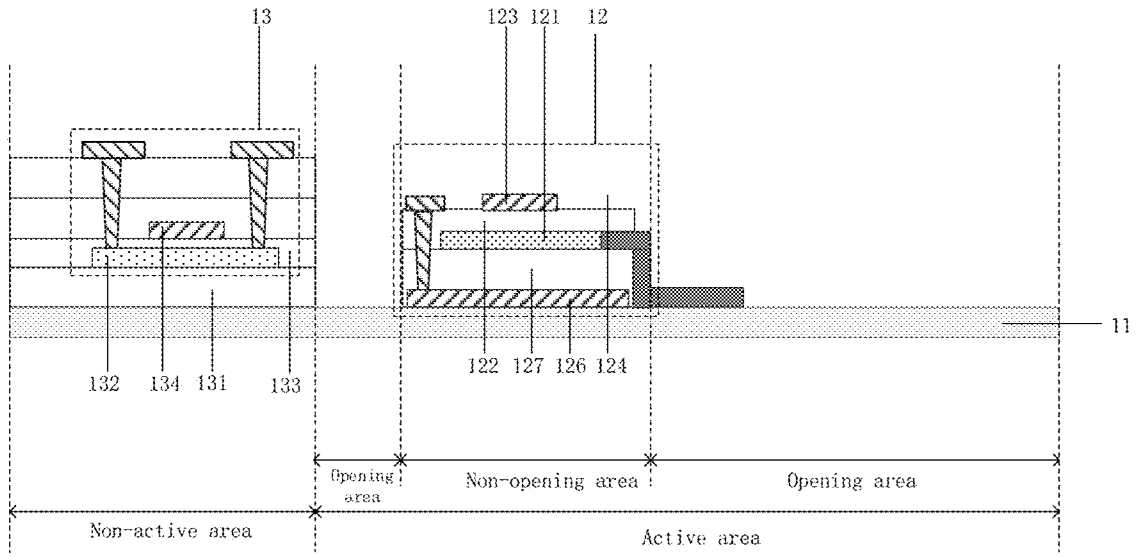
FIG. 16 shows a schematic sectional structural diagram of a displaying base plate when the first grid electrode is completely manufactured according to an embodiment of the present disclosure.
Figure 17:
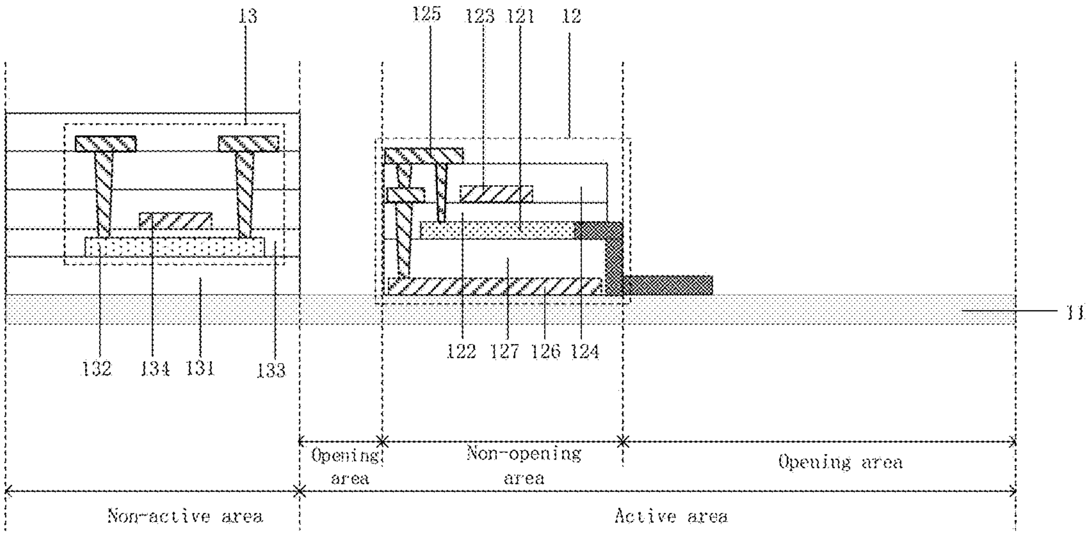
FIG. 17 shows a schematic sectional structural diagram of the displaying base plate when the first source electrode and the first interlayer dielectric layer are completely manufactured according to an embodiment of the present disclosure.
Figure 18:
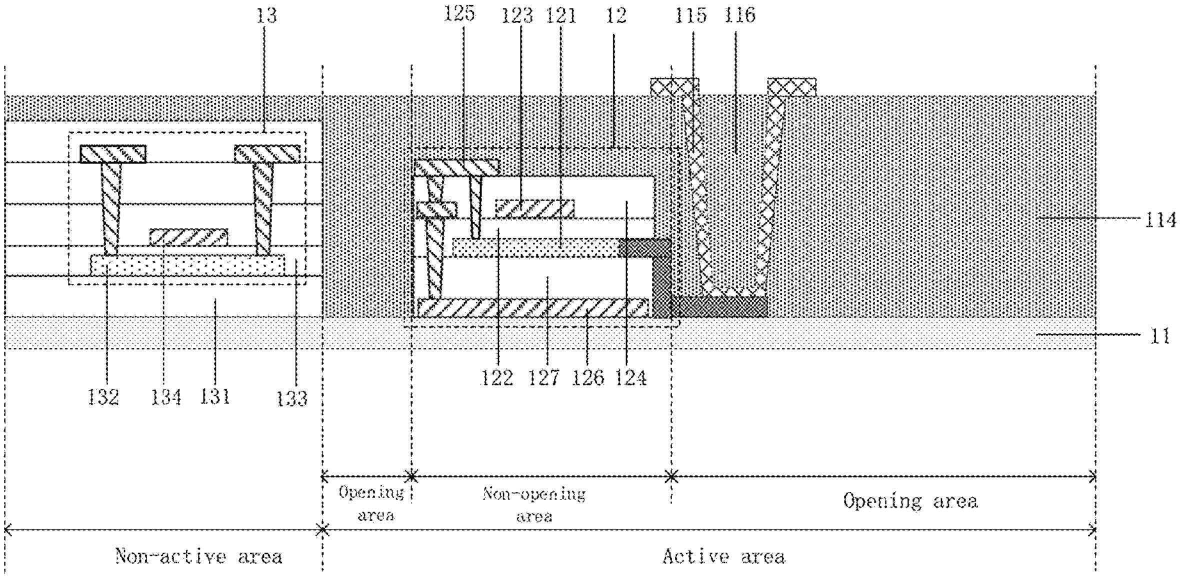
FIG. 18 shows a schematic sectional structural diagram of the displaying base plate when the fourth planarization layer, the fourth transparent electrode layer, the fifth planarization layer and the pixel-electrode layer are completely manufactured according to an embodiment of the present disclosure.

In an optional implementation, the manufacturing method of the displaying base plate may specifically include the following steps:

step 1: the buffer layer 131 and a-Si are deposited on the substrate 11, the a-Si is crystallized to form p-Si, and thus, a structure shown in FIG. 9 is obtained;

step 2: the p-Si is patterned to obtain the second active layer 132; and the buffer layer 131 is patterned, the buffer layer 131 in the non-active area is merely retained, the buffer layer 131 in the active area is etched, and thus, a structure shown in FIG. 10 is obtained;

step 3: the second grid insulating layer 133 is deposited, the second grid insulating layer 133 in the active area is excavated out and patterned to obtain the second grid electrode 134 and the barrier layer 126, and thus, a structure shown in FIG. 11 is obtained;

step 4: the second interlayer dielectric layer 127 is deposited to obtain a structure shown in FIG. 12; and the second interlayer dielectric layer 127 is patterned, the second interlayer dielectric layer 127 in the opening area is excavated out, and thus, a structure shown in FIG. 13 is obtained;

step 5: an IGZO is deposited and is patterned and treated as a conductor to form the first active layer 121, and thus, a structure shown in FIG. 14 is obtained;

step 6: the first grid insulating layer 122 is deposited, the first grid insulating layer 122 in the opening area is excavated out, a via hole is formed in a corresponding position, and thus, a structure shown in FIG. 15 is obtained;

step 7: a grid metal is deposited and is patterned to form the first grid electrode 123 as well as the source and drain of the second thin-film transistor 13, and thus, a structure shown in FIG. 16 is obtained;

step 8: the first interlayer dielectric layer 124 and a metal material are deposited and are patterned to form the first source electrode 125, the first interlayer dielectric layer 124 in the opening area is excavated out, and thus, a structure shown in FIG. 17 is obtained;

step 9: the fourth planarization layer 114, the fourth transparent electrode layer 115 and the fifth planarization layer 116 are sequentially formed, and thus, a structure shown in FIG. 18 is obtained; and step 10: the pixel-electrode layer 19, the fourth passivation layer 17 and the common-electrode layer 118 are sequentially formed, and thus, a structure shown in FIG. 2 is obtained.

All the embodiments of the description are described in a mode of progression, each of the embodiments emphatically describes the differences from the other embodiments, and the same or similar parts of the embodiments may refer to each other.

Finally, it should be further noted that, in the present text, relation terms such as first and second are merely intended to distinguish one entity or operation from another entity or operation, and that does not necessarily require or imply that these entities or operations have therebetween any such actual relation or order. Furthermore, the terms "include", "including" or any variants thereof are intended to cover non-exclusive inclusions, so that processes, methods, articles or devices that include a series of elements not only include these elements, but also include other elements that are not explicitly listed, or include the elements that are inherent to such processes, methods, articles or devices. Unless further limitation is set forth, an element defined by the wording "including a . . . " does not exclude additional same element in the process, method, article or device including the element.

The displaying base plate and the manufacturing method thereof, and the displaying device according to the present disclosure have been described in detail above. The principle and the implementations of the present disclosure are described herein with reference to the specific examples, and the description of the above embodiments is merely intended to facilitate to understand the method according to the present disclosure and its core concept. Moreover, for the ordinary skill in the art, according to the concept of the present disclosure, the specific implementations and the range of application may be varied. In conclusion, the contents of the description should not be understood as limiting the present disclosure.

The skilled in the art, after considering the description and implementing the invention disclosed herein, will readily envisage other embodiments of the present disclosure. The present disclosure aims at encompassing any variations, uses or adaptative alternations of the present disclosure, wherein these variations, uses or adaptative alternations follow the general principle of the present disclosure and include common knowledge or common technical means in the art that are not disclosed in the present disclosure. The description and the embodiments are merely deemed as exemplary, and the true scope and spirit of the present disclosure are presented by the following claims.

It should be understood that the present disclosure is not limited to the accurate structure that is described above and shown in the drawings, and may have various modifications and variations without departing from its scope. The scope of the present disclosure is merely limited by the appended claims.

The "one embodiment", "an embodiment" or "one or more embodiments" as used herein means that specific features, structures or characteristics described with reference to an embodiment are included in at least one embodiment of the present disclosure. Moreover, it should be noted that, here, an example using the wording "in an embodiment" does not necessarily refer to the same one embodiment.

The description disposed herein describes many concrete details. However, it may be understood that the embodiments of the present disclosure may be implemented without these concrete details. In some of the examples, well-known methods, structures and techniques are not described in detail so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware including several different elements and by means of a properly programmed computer. In unit claims that list several devices, some of these devices may be embodied by the same item of hardware. The words first, second, third and so on do not denote any order. These words may be interpreted as names.

Finally, it should be noted that the above embodiments are merely intended to explain the technical solutions of the present disclosure, and not to limit them. Although the present disclosure is explained in detail with reference to the above embodiments, the ordinary skill in the art should understand that he may still modify the technical solutions set forth by the above embodiments, or make equivalent substitutions to parts of the technical features of them. However, these modifications or substitutions do not make the essence of the corresponding technical solutions depart from the spirit and scope of the technical solutions of the embodiments of the present disclosure.

The invention claimed is:

1. A displaying base plate, wherein the displaying base plate has an active area and a non-active area located at a periphery of the active area, the active area comprises an opening area and a non-opening area, and the displaying base plate comprises:

a substrate and a thin-film transistor disposed on one side of the substrate, wherein an excavation area is disposed on an auxiliary film layer, and an orthographic projection of the excavation area on the substrate at least partially covers the opening area;

the thin-film transistor comprises a first thin-film transistor located in the active area, the first thin-film transistor comprises a first active layer, a first grid insulating layer, a first grid electrode, a first interlayer dielectric layer and a first source electrode that are arranged in layer configuration, and the first active layer is disposed close to the substrate;

the auxiliary film layer comprises the first grid insulating layer and the first interlayer dielectric layer;

a first passivation layer and a first transparent electrode layer are further arranged in layer configuration on the side, away from the substrate, of the first source electrode, and the first passivation layer is disposed close to the substrate;

the first transparent electrode layer comprises a first transferring electrode, and the first transferring electrode and a drain contacting area of the first active layer are connected by via holes disposed in the first passivation layer, the first interlayer dielectric layer and the first grid insulating layer;

the auxiliary film layer further comprises the first passivation layer;

the first transparent electrode layer further comprises a second transferring electrode integrated with the first transferring electrode, and the second transferring electrode is located in the non-opening area;

a second planarization layer is disposed on the side, away from the substrate, of the first transparent electrode layer, a first through hole is disposed in the second planarization layer, and the first through hole penetrates through the second planarization layer to expose the second transferring electrode;

a second transparent electrode layer, a third planarization layer and a pixel-electrode layer are arranged in layer configuration on the side, away from the substrate, of the second planarization layer, wherein the second transparent electrode layer is disposed close to the substrate, an orthographic projection of the second transparent electrode layer on the substrate covers an orthographic projection of the first through hole on the substrate, the second transparent electrode layer is used for connecting the pixel-electrode layer and the second transferring electrode, and the third planarization layer is configured for planarizing the first through hole; and the active area further comprises a data line and a scanning line, the first source electrode extends in a first direction to form the data line, the first grid electrode extends in a second direction intersecting with the first direction to form the scanning line, and both of an orthographic projection of the data line and an orthographic projection of the scanning line on the substrate cover an orthographic projection of a channel area of the first active layer on the substrate.

2. The displaying base plate according to claim 1, wherein an orthographic projection of the auxiliary film layer on the substrate does not overlap with the opening area.

3. The displaying base plate according to claim 1, wherein the first thin-film transistor further comprises a barrier layer and a second interlayer dielectric layer that are disposed between the substrate and the first active layer, and the first active layer is disposed on the side, away from the substrate, of the second interlayer dielectric layer; and the auxiliary film layer further comprises the second interlayer dielectric layer.

4. The displaying base plate according to claim 3, wherein the barrier layer is made of a material comprising at least one of molybdenum, aluminum and silver.

5. The displaying base plate according to claim 1, wherein the thin-film transistor comprises the first thin-film transistor located in the active area and a second thin-film transistor located in the non-active area, and the first active layer of the first thin-film transistor is made of a material comprising a metal oxide;

the second thin-film transistor comprises a buffer layer, a second active layer, a second grid insulating layer and a second grid electrode that are arranged in layer configuration on the substrate, the second active layer is disposed close to the substrate; the first thin-film transistor is located on the side, away from the substrate, of the second grid electrode, and the second active layer is made of a material comprising polycrystalline silicon;

the auxiliary film layer comprises the buffer layer and the second grid insulating layer, and an orthographic projection of excavation areas of the buffer layer and an orthographic projection of the second grid insulating layer on the substrate at least partially cover the active area; wherein a first planarization layer is formed on the side, away from the substrate, of the first thin-film transistor; and the first planarization layer is disposed with a step part having a first portion on the edges of the buffer layer and the second grid insulating layer and having a second portion close to the active area, and a thickness of the step part close to a side of the non-active area is smaller than a thickness of the step part close to a side of the active area.

6. The displaying base plate according to claim 1, wherein a fourth passivation layer and a common-electrode layer are arranged in layer configuration on the side, away from the substrate, of the pixel-electrode layer, and the fourth passivation layer is disposed close to the substrate, wherein the common-electrode layer comprises a plurality of strip electrodes, and the common-electrode layer is made of a metal.

7. The displaying base plate according to claim 1, wherein the first active layer is made of a material comprising polycrystalline silicon, and an orthographic projection of the data line on the substrate covers an orthographic projection of the first active layer on the substrate.

8. The displaying base plate according to claim 1, wherein a channel area of the first active layer comprises a first channel area, a first resistor area and a second channel area that are sequentially disposed in a first direction, the first grid electrode comprises a first sub-grid electrode and a second sub-grid electrode that are disposed, respectively, an orthographic projection of the first sub-grid electrode on the substrate covers an orthographic projection of the first channel area on the substrate, and an orthographic projection of the second sub-grid electrode on the substrate covers an orthographic projection of the second channel area on the substrate.

9. A displaying device, comprising the displaying base plate according to claim 1.

10. A displaying base plate, wherein the displaying base plate has an active area and a non-active area located at a periphery of the active area, the active area comprises an opening area and a non-opening area, and the displaying base plate comprises:

a substrate and a thin-film transistor disposed on one side of the substrate, wherein an excavation area is disposed on an auxiliary film layer, and an orthographic projection of the excavation area on the substrate at least partially covers the opening area;

the thin-film transistor comprises a first thin-film transistor located in the active area, the first thin-film transistor comprises a first active layer, a first grid insulating layer, a first grid electrode, a first interlayer dielectric layer and a first source electrode that are arranged in layer configuration, and the first active layer is disposed close to the substrate;

the auxiliary film layer comprises the first grid insulating layer and the first interlayer dielectric layer;

a first drain electrode is further disposed on the side, away from the substrate, of the first interlayer dielectric layer, and the first drain electrode and the first source electrode are disposed on a same layer;

a first transparent electrode layer is further disposed on the side, away from the substrate, of the first drain electrode, the first transparent electrode layer comprises a first transferring electrode, the first transferring electrode is contact connected with the first drain electrode, and the first drain electrode and a drain contacting area of the first active layer are connected by via holes disposed in the first interlayer dielectric layer and the first grid insulating layer;

a second passivation layer and a third transparent electrode layer are arranged in layer configuration on the side, away from the substrate, of the first transparent electrode layer, the second passivation layer is disposed close to the substrate, the third transparent electrode layer is connected with a first constant-electric-potential input terminal, and an orthographic projection of the third transparent electrode layer on the substrate overlaps with an orthographic projection of the first transparent electrode layer on the substrate; and a third passivation layer and a data line are arranged in layer configuration on the side, away from the substrate, of the third transparent electrode layer, the third passivation layer is disposed close to the substrate, the data line and the first source electrode are connected by via holes disposed in the third passivation layer and the second passivation layer, the first source electrode and a source contacting area of the first active layer are connected by via holes disposed in the first grid insulating layer and the first interlayer dielectric layer, and an orthographic projection of the data line on the substrate covers an orthographic projection of the first active layer, an orthographic projection of the first source electrode and an orthographic projection of the first drain electrode on the substrate.

11. A displaying base plate, wherein the displaying base plate has an active area and a non-active area located at a periphery of the active area, the active area comprises an opening area and a non-opening area, and the displaying base plate comprises:

a substrate and a thin-film transistor disposed on one side of the substrate, wherein an excavation area is disposed on an auxiliary film layer, and an orthographic projection of the excavation area on the substrate at least partially covers the opening area;

the thin-film transistor comprises a first thin-film transistor located in the active area, the first thin-film transistor comprises a first active layer, a first grid insulating layer, a first grid electrode, a first interlayer dielectric layer and a first source electrode that are arranged in layer configuration, and the first active layer is disposed close to the substrate;

the auxiliary film layer comprises the first grid insulating layer and the first interlayer dielectric layer;

the first active layer is made of a material comprising a metal oxide, the first active layer comprises a drain contacting area, and the drain contacting area is located in the opening area; wherein an orthographic projection of the auxiliary film layer on the substrate does not overlap with the opening area, a fourth planarization layer is disposed on the side, away from the substrate, of the drain contacting area, a second through hole is disposed in the fourth planarization layer, and the second through hole penetrates through the fourth planarization layer to expose the drain contacting area; and a fourth transparent electrode layer, a fifth planarization layer and a pixel-electrode layer are arranged in layer configuration on the side, away from the substrate, of the fourth planarization layer, wherein the fourth transparent electrode layer is disposed close to the substrate, an orthographic projection of the fourth transparent electrode layer on the substrate covers an orthographic projection of the second through hole on the substrate, the fourth transparent electrode layer is configured for connecting the pixel-electrode layer and the drain contacting area, and the fifth planarization layer is configured for planarizing the second through hole; wherein an orthographic projection of the auxiliary film layer on the substrate does not overlap with the opening area, the pixel-electrode layer is disposed on the side, away from the substrate, of the drain contacting area, and the pixel-electrode layer is in contact connection with the drain contacting area.

* * * * *